United States Patent
Peng et al.

(10) Patent No.: US 10,838,726 B1
(45) Date of Patent: Nov. 17, 2020

(54) ASYNCHRONOUS FIFO BUFFER FOR REDUNDANT COLUMNS IN MEMORY DEVICE

(71) Applicant: SanDisk Technologies LLC, Addison, TX (US)

(72) Inventors: Min Peng, San Jose, CA (US); Yenlung Li, San Jose, CA (US); Chen Chen, Mountain View, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/674,257

(22) Filed: Nov. 5, 2019

(51) Int. Cl.
| | |
|---|---|
| *G06F 9/38* | (2018.01) |
| *G06F 9/30* | (2018.01) |
| *G06F 12/02* | (2006.01) |
| *G11C 11/4096* | (2006.01) |
| *G06F 13/16* | (2006.01) |
| *G06F 11/16* | (2006.01) |
| *G06F 12/0831* | (2016.01) |

(52) U.S. Cl.
CPC ........ *G06F 9/3814* (2013.01); *G06F 9/30047* (2013.01); *G06F 11/1658* (2013.01); *G06F 12/0207* (2013.01); *G06F 12/0831* (2013.01); *G06F 13/1668* (2013.01); *G11C 11/4096* (2013.01)

(58) Field of Classification Search
CPC .............. G11C 11/4096; G11C 7/1075; G11C 11/40603; G11C 7/1039; G11C 7/1078; G11C 7/10; G06F 9/3814; G06F 12/0207; G06F 12/0831; G06F 13/1668; G06F 11/1658; G06F 9/30047; G06F 5/065
See application file for complete search history.

(56) References Cited

U.S. PATENT DOCUMENTS

| | | |
|---|---|---|
| 6,816,420 B1 | 11/2004 | Liu et al. |
| 7,170,802 B2 | 1/2007 | Cernea et al. |
| 7,394,690 B2 | 7/2008 | Moogat et al. |
| 7,821,830 B2 | 10/2010 | Han et al. |
| 7,966,532 B2 | 6/2011 | Bottelli et al. |
| 8,190,950 B2 | 5/2012 | Chen et al. |
| 8,681,548 B2 | 3/2014 | Liu et al. |
| 9,076,506 B2 | 7/2015 | Tsai |
| 9,076,531 B2 | 7/2015 | Arakawa |
| 9,146,807 B2 | 9/2015 | Yurzola et al. |
| 9,490,035 B2 | 11/2016 | Tsai et al. |
| 9,703,719 B2 | 7/2017 | Balakrishnan et al. |
| 9,852,078 B2 | 12/2017 | Zaitsu et al. |

(Continued)

*Primary Examiner* — Ajay Ojha
(74) *Attorney, Agent, or Firm* — Vierra Magen Marcus LLP

(57) ABSTRACT

Apparatuses and techniques are described for accessing redundant columns of data in a memory device. To facilitate scaling of a memory device and reduce a clock rate used to access latches of the redundant columns in program and read operations, one or more first-in, first out (FIFO) buffers are provided to output data to, and receive data from, the latches. The FIFO buffers act as an interface between a controller and the latches, and exchange data with the controller at a relatively high clock rate, and exchange data with the latches of the redundant columns at a slower clock rate. During a read operation, the FIFO can prefetch read data from one or more columns and store it until it is needed to replace the data of a defective primary column.

18 Claims, 17 Drawing Sheets

(56) References Cited

U.S. PATENT DOCUMENTS

| | | | | |
|---|---|---|---|---|
| 2002/0056021 | A1* | 5/2002 | Manning | H04L 7/005 |
| | | | | 711/105 |
| 2003/0053348 | A1 | 3/2003 | Marotta | |
| 2006/0109715 | A1* | 5/2006 | Lee | G11C 29/846 |
| | | | | 365/185.17 |
| 2009/0161429 | A1* | 6/2009 | Chen | G11C 29/82 |
| | | | | 365/185.09 |
| 2009/0182914 | A1* | 7/2009 | Matsui | G11C 7/1075 |
| | | | | 710/100 |

* cited by examiner

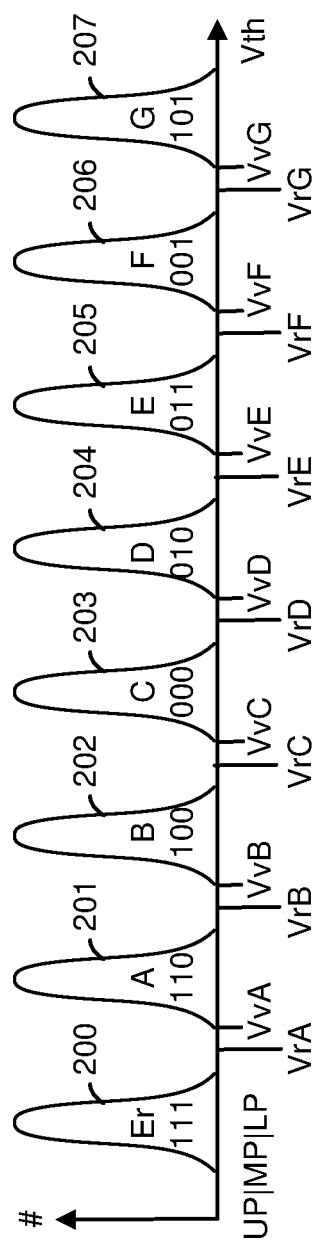

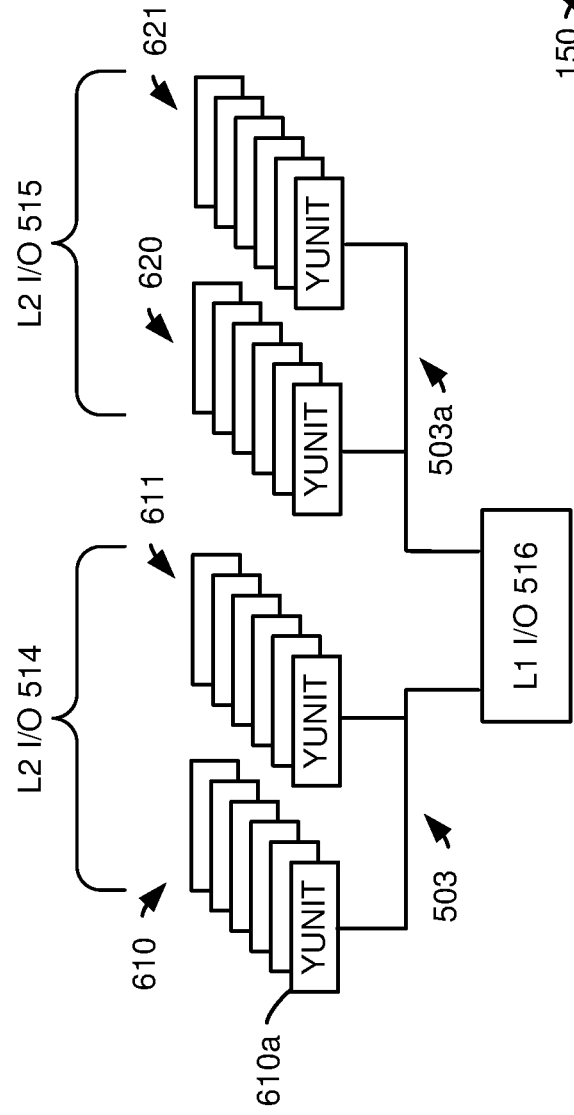
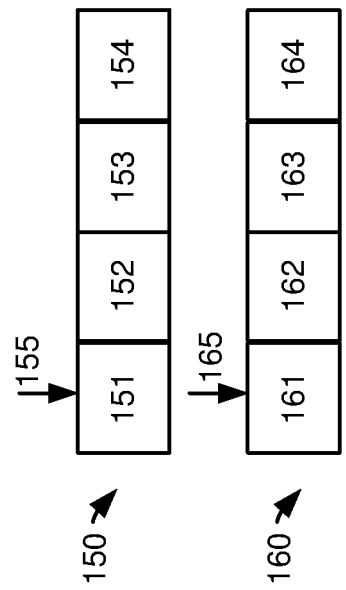
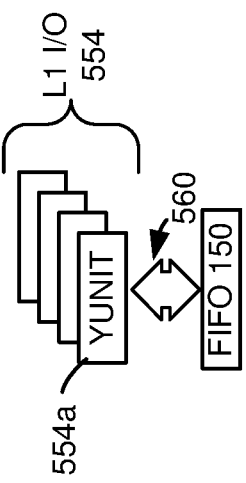

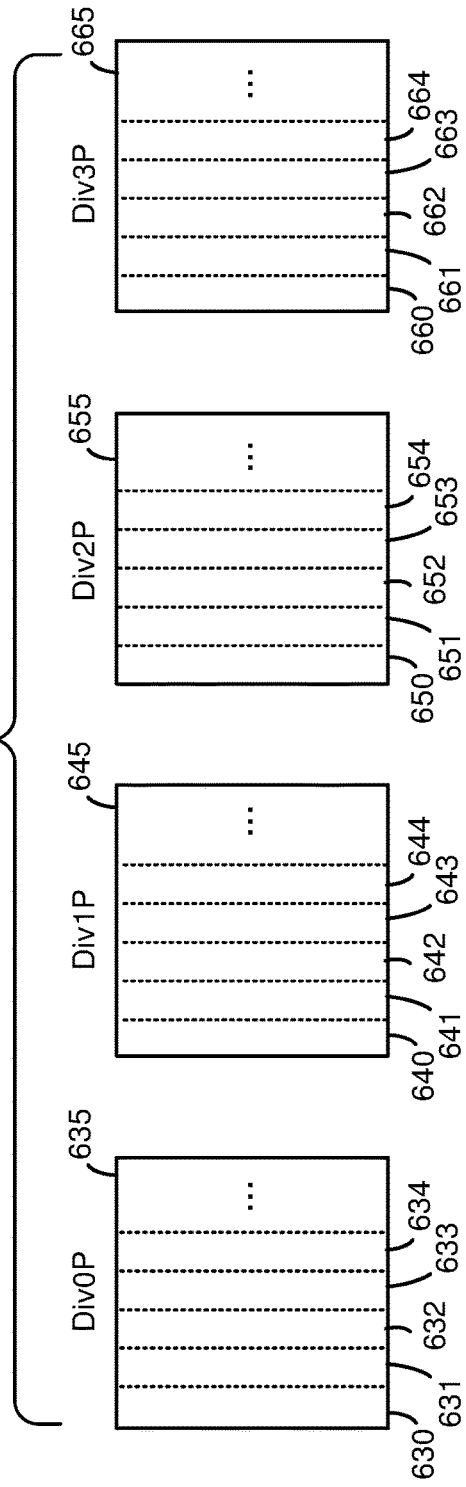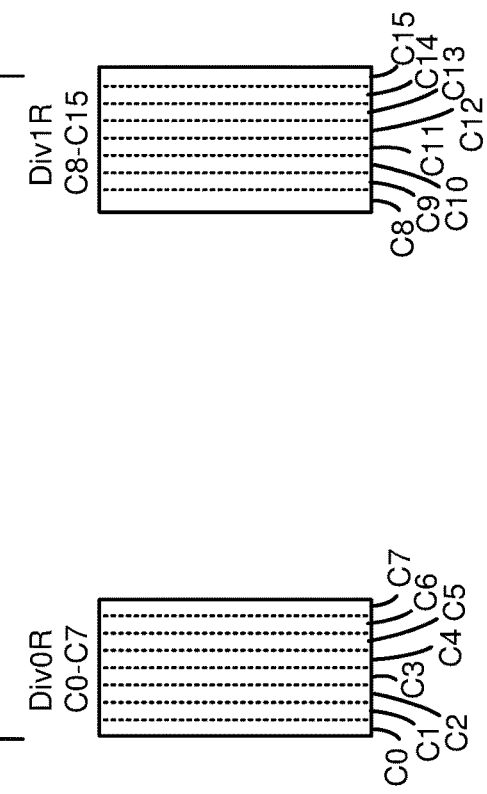

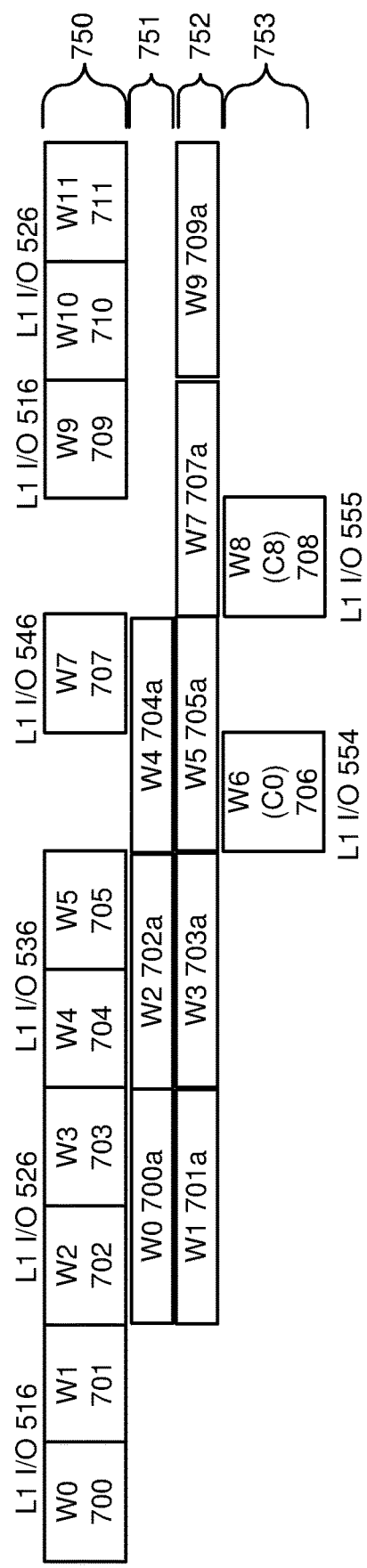
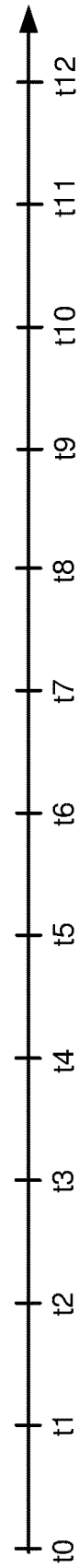
Fig. 7A
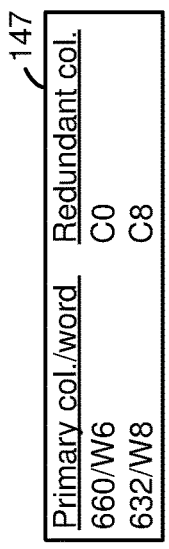
Fig. 7B

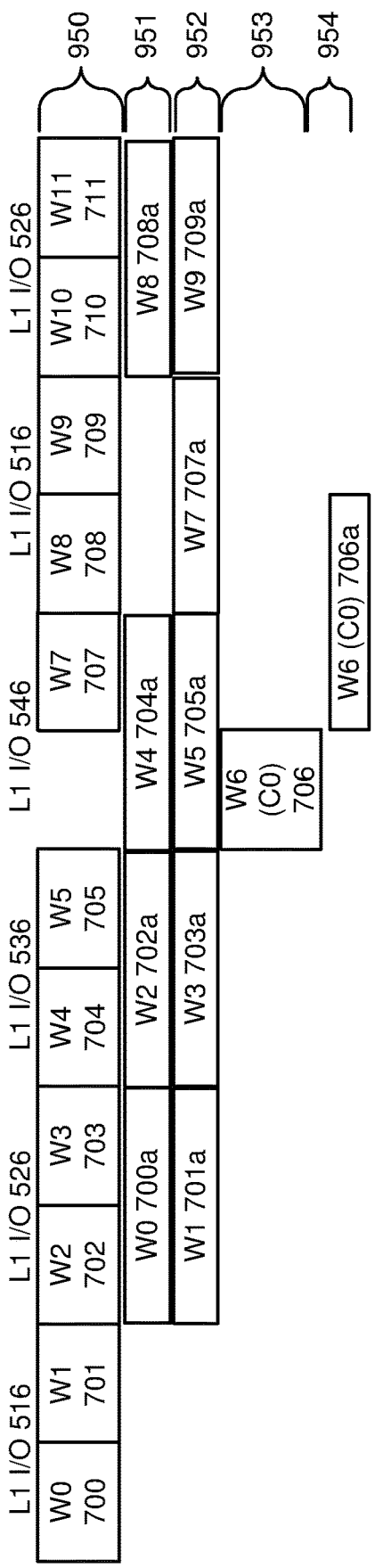
Fig. 9A
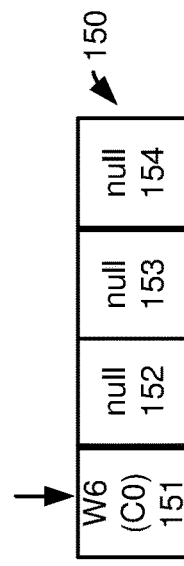
Fig. 9B
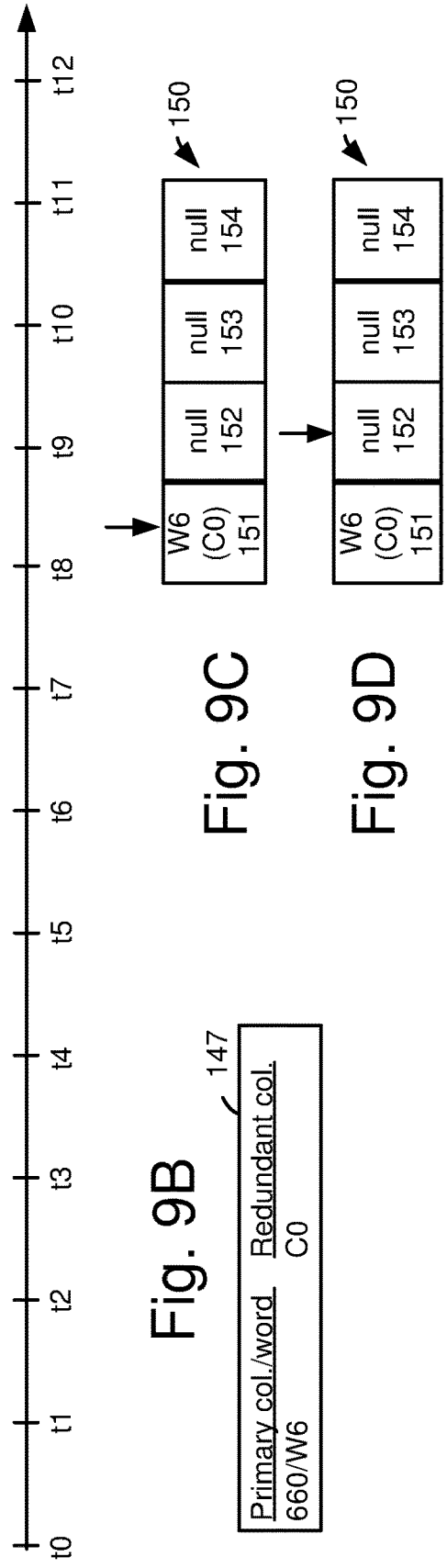
Fig. 9C
Fig. 9D

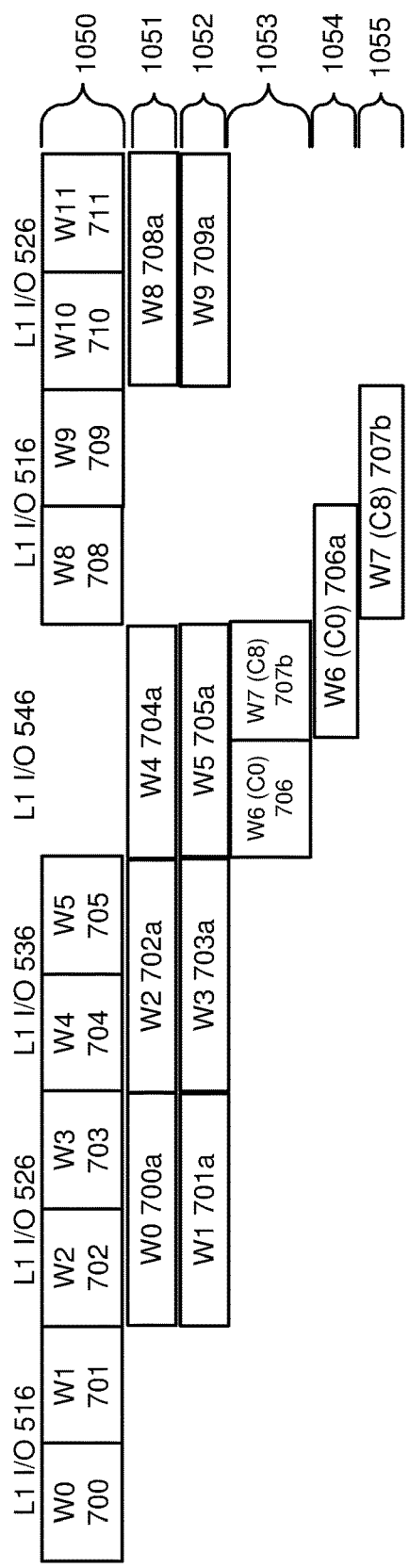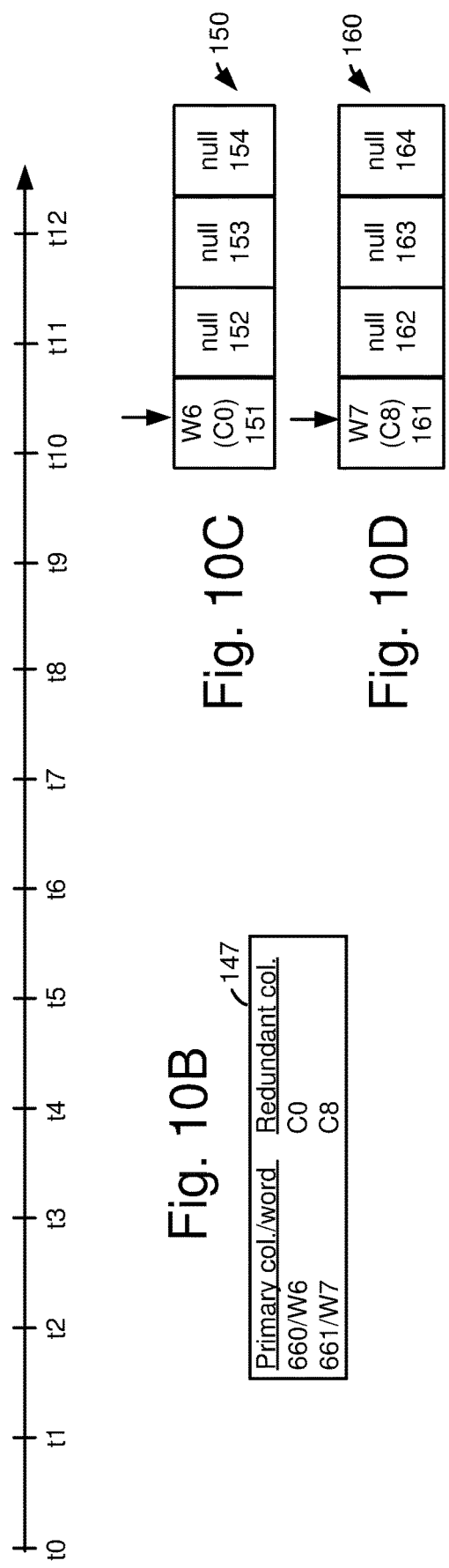
Fig. 10A
Fig. 10B
Fig. 10C
Fig. 10D

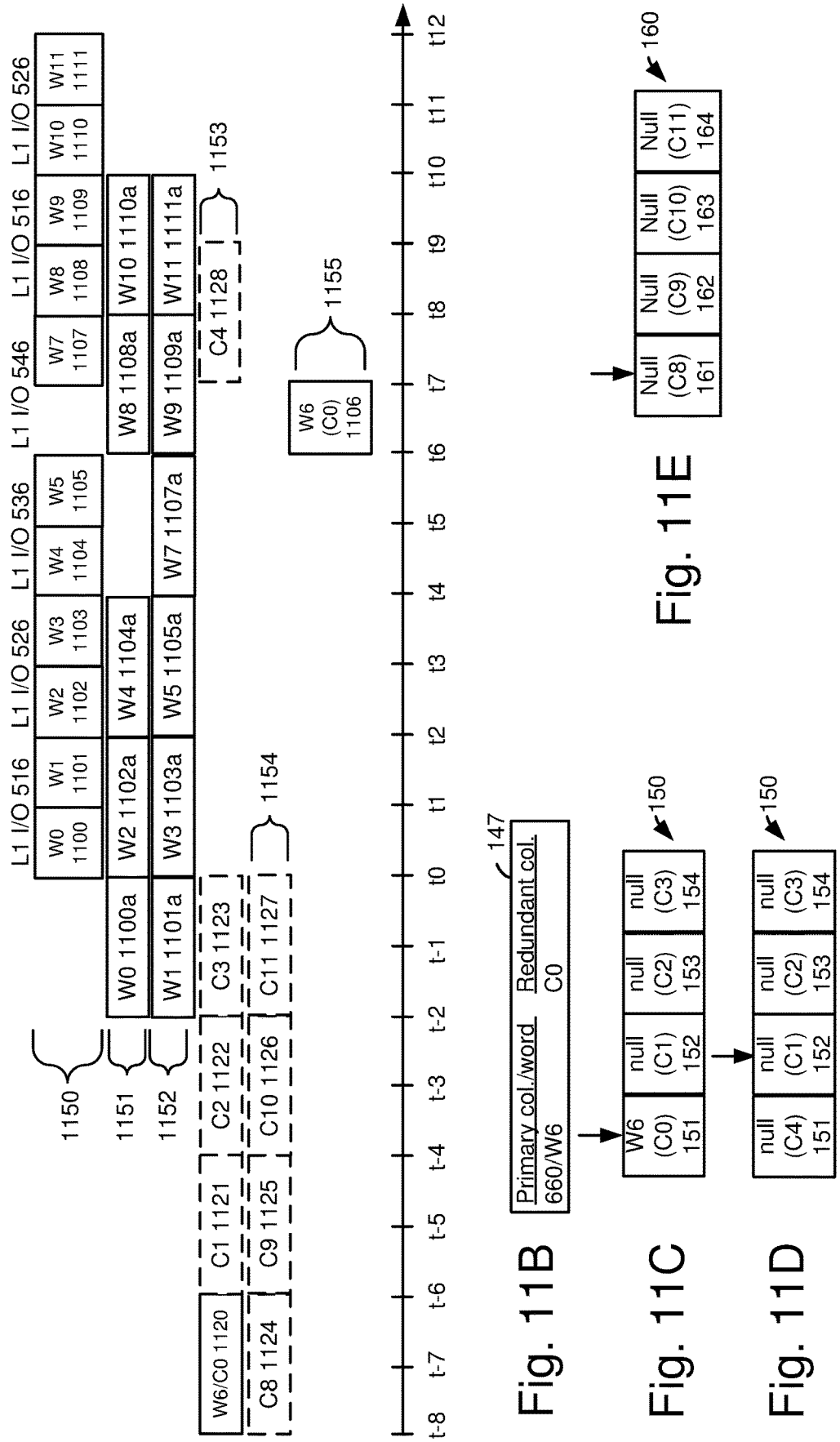

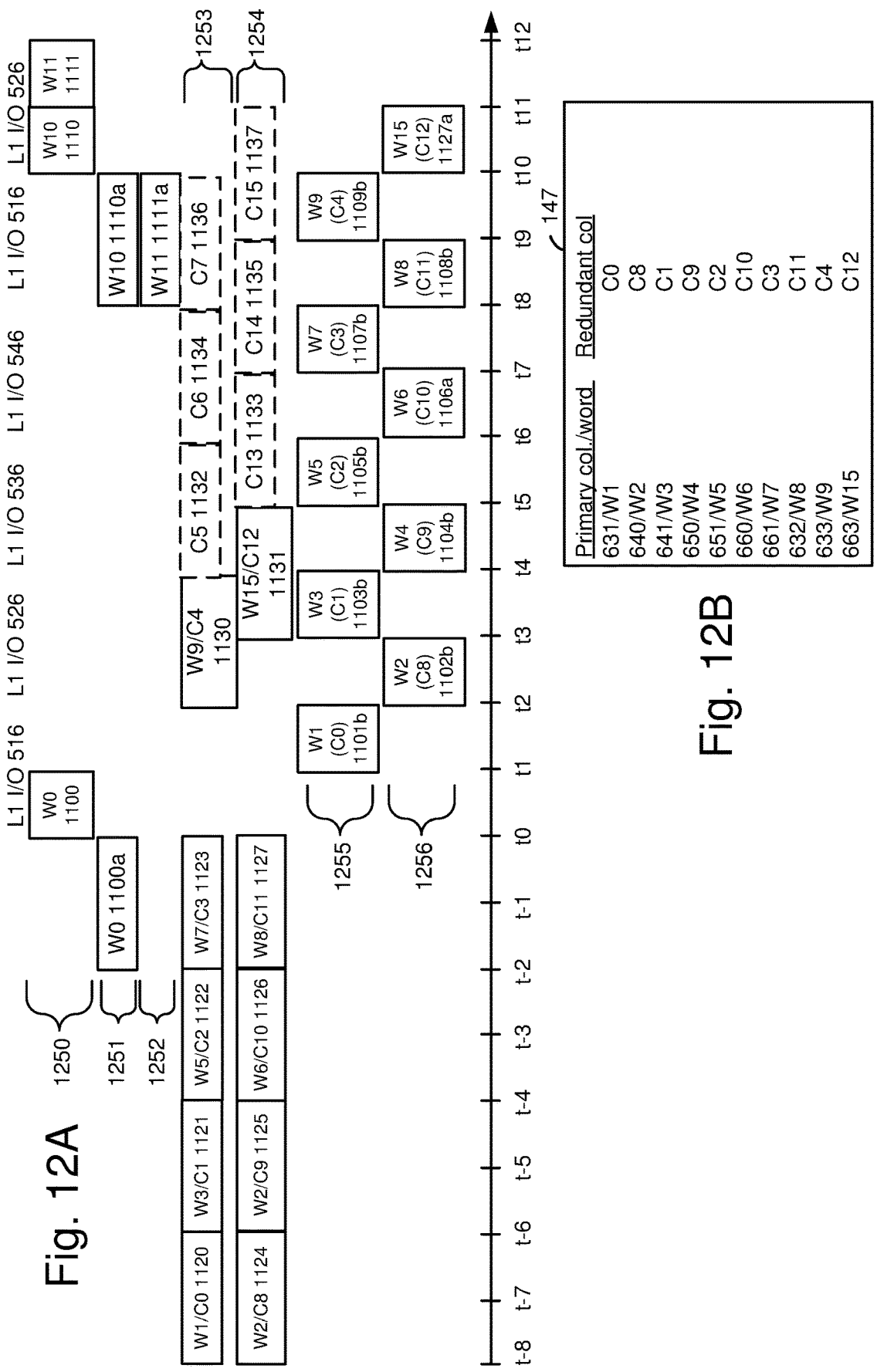

ASYNCHRONOUS FIFO BUFFER FOR REDUNDANT COLUMNS IN MEMORY DEVICE

BACKGROUND

The present technology relates to the operation of storage and memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device can include memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 2A depicts example write data in the latches 194-197 of FIG. 1B in a program operation.

FIG. 2B depicts a threshold voltage distribution of a set of memory cells, using eight data states, consistent with FIG. 2A.

FIG. 6B depicts an example configuration of the L1 I/O circuit 516 and the associated L2 I/O circuits 514 and 515 for the primary columns of Div0P of FIG. 6A.

FIG. 6C depicts an example configuration of the L1 I/O circuit 554 and the associated FIFO buffer 150 for the redundant columns of Div0R of FIG. 6A.

FIG. 6D depicts an example configuration of FIFO buffers 150 and 160.

FIG. 6E depicts example primary columns in the divisions Div0P-Div3P of FIG. 6A.

FIG. 6F depicts example redundant columns in the divisions Div0R and Div1R of FIG. 6A.

FIG. 6G depicts an example assignment of words to the columns in FIG. 6E.

FIG. 7A depicts an example timeline in a program operation using the access circuitry of FIG. 5, where there are two bad columns.

FIG. 7B depicts an example of the column replacement table 147 of FIG. 1, consistent with FIG. 7A.

FIG. 9A depicts an example timeline in a program operation using the access circuitry of FIG. 6A, consistent with the process of FIG. 8A, where there is one bad column.

FIG. 9B depicts an example of the column replacement table 147 of FIG. 1, consistent with FIG. 9A.

FIG. 9C depicts an example configuration of the FIFO buffer 150 (e.g., of FIG. 6D), consistent with the timeline of FIG. 9A, showing write data W6 for column C0 being stored in the entry 151, which is selected by the pointer.

FIG. 9D depicts an example configuration of the FIFO buffer 150 of FIG. 9C, showing the pointer being moved to the entry 152 after the write data W6 is transferred from the entry 151 to the column C0 via the L1 I/O circuit 554.

FIG. 10A depicts an example timeline in a program operation using the access circuitry of FIG. 6A, and consistent with the process of FIG. 8A, where there are two bad columns.

FIG. 10B depicts an example of the column replacement table 147 of FIG. 1, consistent with FIG. 10A.

FIG. 10C depicts an example configuration of the FIFO buffer 150, consistent with the timeline of FIG. 10A, showing write data W6 for column C0 being stored in entry 151, which is selected by the pointer.

FIG. 10D depicts an example configuration of the FIFO buffer 160 (e.g., of FIG. 6D), consistent with the timeline of FIG. 10A, showing write data W7 for column C8 being stored in entry 161, which is selected by the pointer.

FIG. 11A depicts an example timeline in a read operation using the access circuitry of FIG. 6A, consistent with the process of FIG. 8C, where there is one bad column.

FIG. 11B depicts an example of the column replacement table 147 of FIG. 1, consistent with FIG. 11A.

FIG. 11C depicts an example configuration of the FIFO buffer 150, consistent with the timeline of FIG. 11A, showing read data from columns C0-C3 being stored in the entries 151-154, respectively, where the entry 151 is selected by the pointer.

FIG. 11D depicts an example configuration of the FIFO buffer 150 of FIG. 11C, showing null read data from a column C4 being stored in the entry 151 after the read data W6 is output to the controller from entry 151, where the pointer is moved to select the entry 152.

FIG. 11E depicts an example configuration of the FIFO buffer 160, consistent with the timeline of FIG. 11A, showing null read data from columns C8-C11 being stored in the entries 161-164, respectively, where the pointer selects the entry 161.

FIG. 12A depicts an example timeline in a read operation using the access circuitry of FIG. 6A, and consistent with the process of FIG. 8C, where there are ten bad columns.

FIG. 12B depicts an example of the column replacement table 147 of FIG. 1, consistent with FIG. 12A.

DETAILED DESCRIPTION

Apparatuses and techniques are described for accessing redundant columns of data in a memory device.

Figure 4:
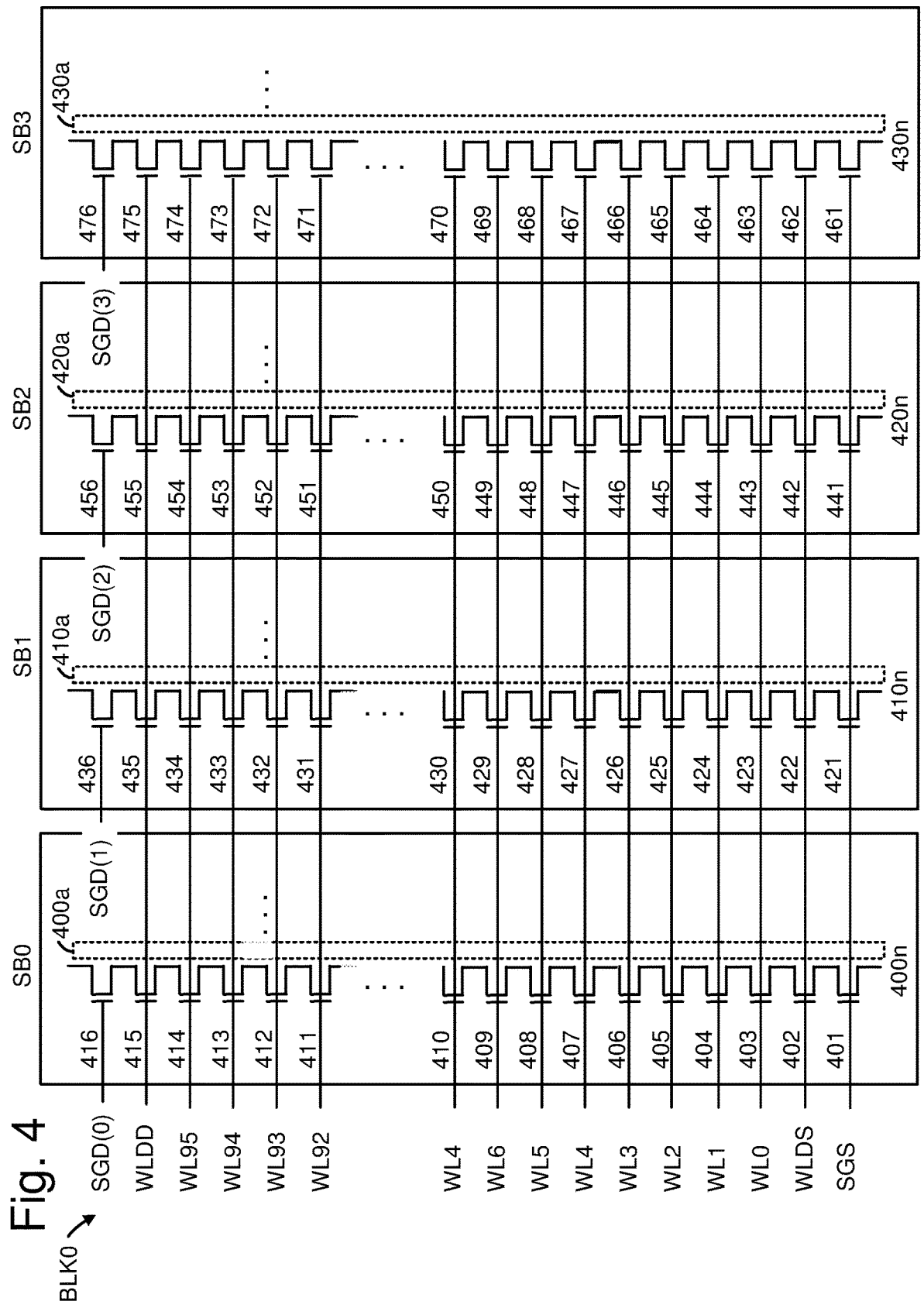
FIG. 4 depicts an example view of NAND strings in a block BLK0 in the memory structure 126 of FIG. 1.

In some memory devices, memory cells are joined to one another such as in NAND strings in a block or sub-block. Referring to FIG. 4, for example, each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells, which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

For example, in a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

After a block of memory cells is erased in an erase operation, programming can occur. During a programming operation, the memory cells are programmed according to a word line programming order. For example, the programming may start at the word line at the source-side of the block and proceed to the word line at the drain-side of the block, one word line at a time. A word line can also be programmed in a sub-block programming order, extending from SB0 to SB3, for example, when there are four sub-blocks (FIG. 4). For example, a portion of the memory cells of WLn in SB0 are first programmed, followed by a portion of the memory cells of WLn in SB1, a portion of the memory cells of WLn in SB2 and then a portion of the memory cells of WLn in SB3. A programming operation may include one or more sets of increasing program voltages or pulses which are applied to a word line in respective program loops or program-verify iterations. Verify tests may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states (see FIG. 2B). In a four-bit per cell memory device, there are sixteen data states, including the erased state S0 and fifteen programmed data states S1-S15. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn. A read operation can involve reading pages of data, one at a time. See FIG. 2A.

Figure 5:
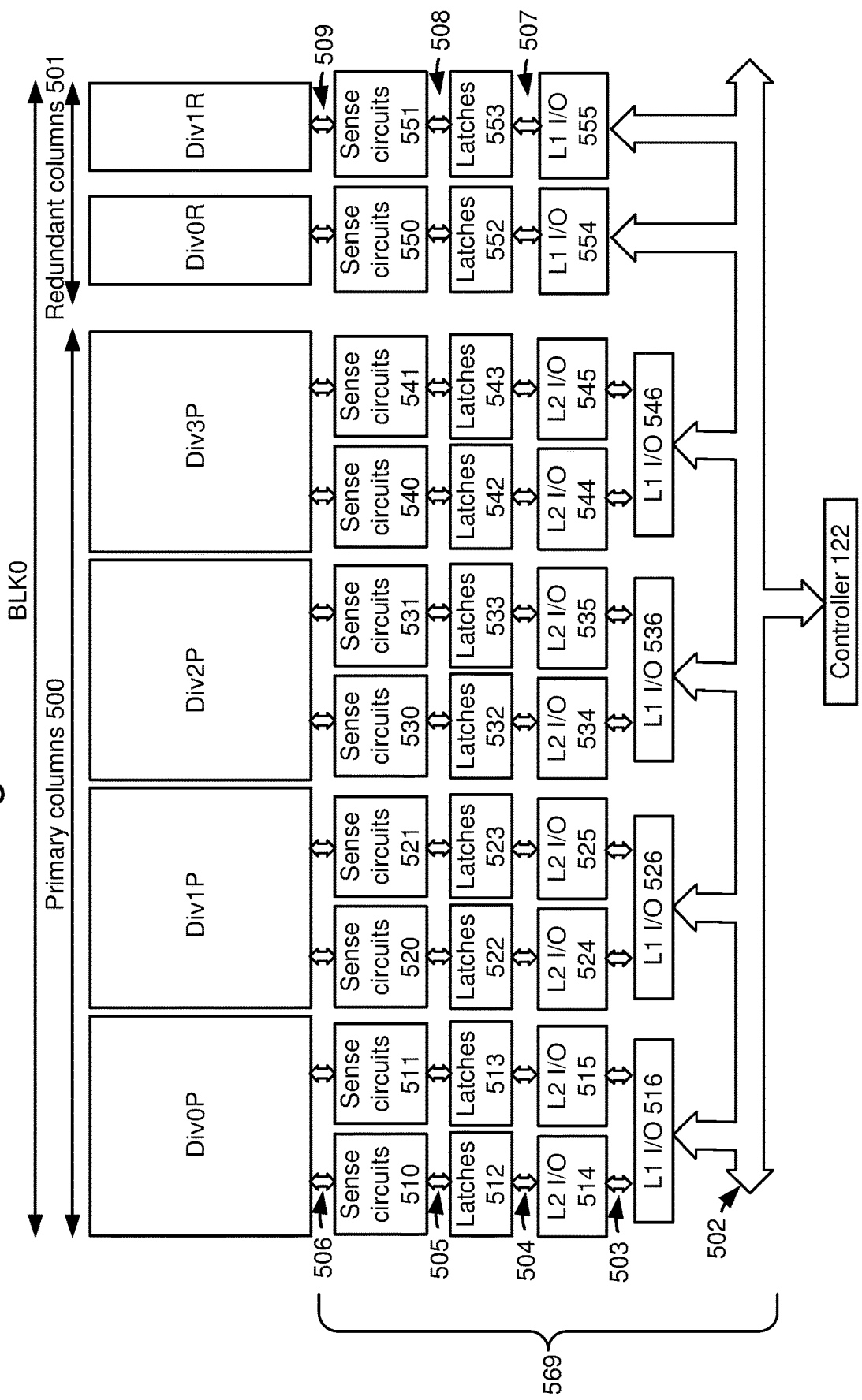
FIG. 5 depicts an example configuration of the block BLK0 of FIG. 4 and associated access circuitry 569, where the NAND strings are arranged in divisions for primary columns and redundant columns.
Figure 6A:
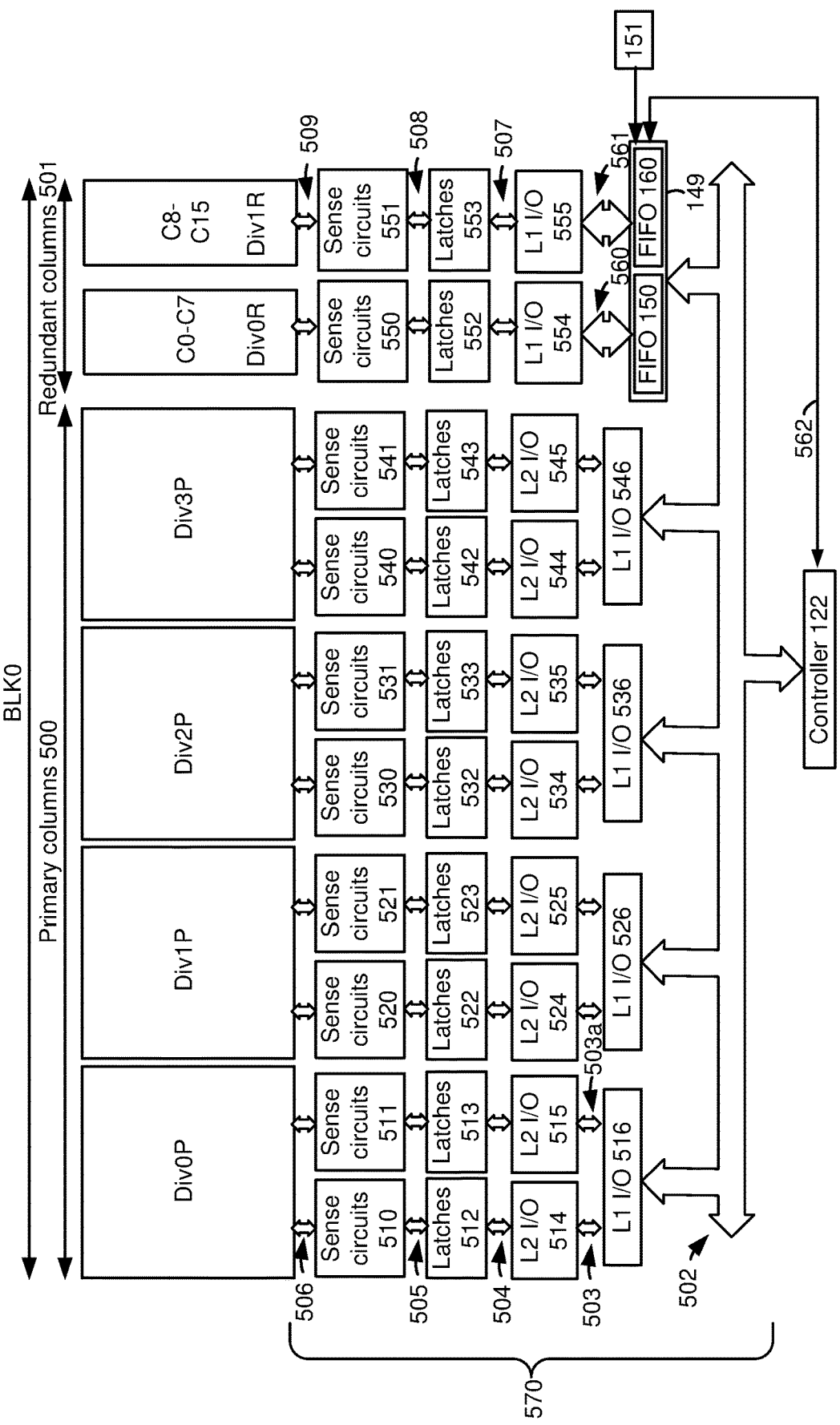
FIG. 6A depicts another example configuration of the block BLK0 of FIG. 4 and associated access circuitry 570, where the NAND strings are arranged in divisions for primary columns and redundant columns, and where the associated access circuitry includes a set of FIFO buffers 149 for the redundant columns.

Each block of memory cells is typically tested at the time of manufacture, before being shipped to the end user, to identify defective (bad) NAND strings which are not suitable for storing data. Defects, including, e.g., short circuits, can be caused by manufacturing variations and other reasons. To address this problem without having to discard an entire block when only one, or a few, NAND strings are defective, a block can include a number of redundant columns of NAND strings which substitute for defective primary columns of NAND strings. A column can represent a set of successive NAND strings such as 16 NAND strings, for example, which store a word of data. As depicted in FIGS. 5 and 6A, for example, a block BLK0 can be divided into a group of primary columns 500 and a group of redundant columns 501. If the testing indicates that a primary column of NAND strings include a defective NAND string, that column is identified in a column replacement table 147 (FIG. 1A) as being replaced by a redundant column.

However, since the number of primary columns is much greater than the number of redundant columns, the access circuitry for the primary columns typically has a higher level of parallelism than the access circuitry for the redundant columns. This increased parallelism slows down the rate at which data is written to, or read from, latches associated with the primary columns In contrast, with the lower level of parallelism in the access circuitry for the redundant columns, a higher rate is used for the data written to, or read from, the latches associated with the redundant columns. The input/output latches (e.g., XDL latches 194a, 195a, 196a and 197a in FIG. 1B) for both the primary and redundant columns are typically sized to accommodate the higher clock rate, interfering with the goal of increased scaling of the memory device.

Techniques provided herein address the above and other issues. In one approach, one or more first-in, first out (FIFO) buffers 150, 160 (FIG. 6A) are provided to output data to, and receive data from, the latches associated with the redundant columns of a block. The FIFO buffers act as an interface between the controller and the latches, and exchanges data with the controller at a relatively high clock rate while exchanging data with the latches of the redundant columns at a slower clock rate. This slower clock rate may be equal to the clock rate at which data is exchanged with the latches of the primary columns.

In one approach, a FIFO buffer is provided for each division of redundant columns. For example see FIFO buffers 150 and 160 for Div0R and Div1R, respectively, in FIG. 6A. Further, the capacity of a FIFO buffer can be less than the capacity of a row of memory cells in the redundant columns. During a program operation, the FIFO buffer can accumulate write data for one or more columns and transmit the write data to the latches of the redundant columns asynchronously relative to the transmission of data to the latches of the primary columns.

During a read operation, the FIFO buffer can prefetch read data from one or more columns and store it until it is needed to replace the data of a defective primary column. When needed, a column of read data can be output from the FIFO buffer to the controller. A pointer of the FIFO buffer is updated to indicate that a next redundant column of data can be read into the FIFO buffer. The prefetch process can occur before data from the primary columns is output to the controller. This approach allows the prefetch process to occur at the relatively slow clock rate, while the output from the FIFO buffer to the controller is at the relatively high clock rate required by the controller.

The FIFO buffer can be configured to operate at a selected clock rates (data rates) among a number of different clock rates (data rates).

These and other features are discussed further below.

Figure 1A:
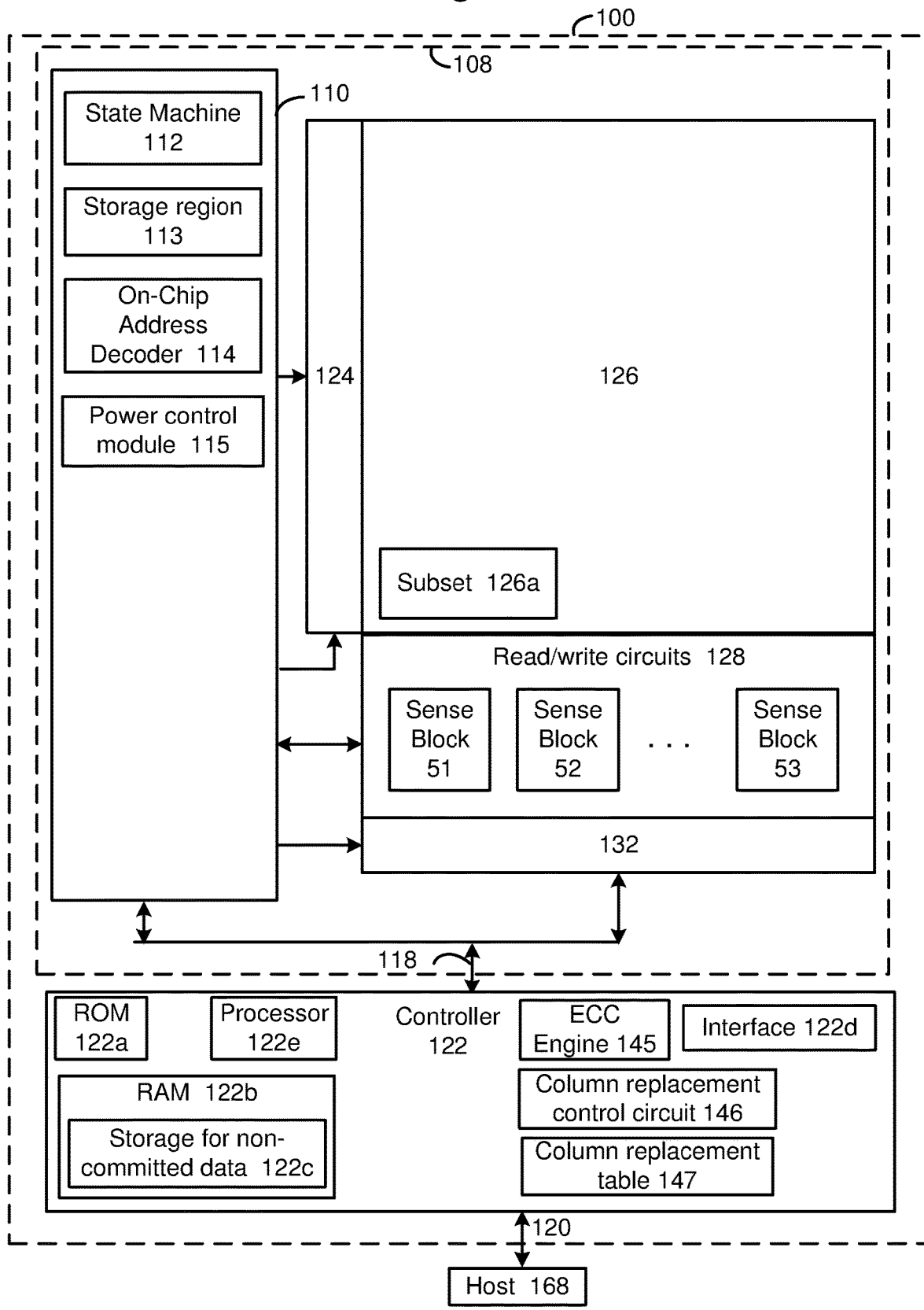
FIG. 1A is a block diagram of an example storage device.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 168 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control module 115 (power control circuit). A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, sense blocks 51, 52, . . . , 53, Oread/write circuits 128, controller 122, and so forth.

The off-chip controller 122 (which in one embodiment is an electrical circuit) may comprise a processor 122e, memory such as ROM 122a and RAM 122b and an error-correction code (ECC) engine 145. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. The storage location 122c may store one or more word lines of data.

The controller may further include a column replacement control circuitry 146 and a column replacement table 147. The column replacement control circuitry may include hardware, software and/or firmware for performing the processes described herein. In program and read operations, the column replacement control circuitry may access the column replacement table to identify addresses of bad, e.g., defective, columns and corresponding redundant columns which replace them.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable m devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
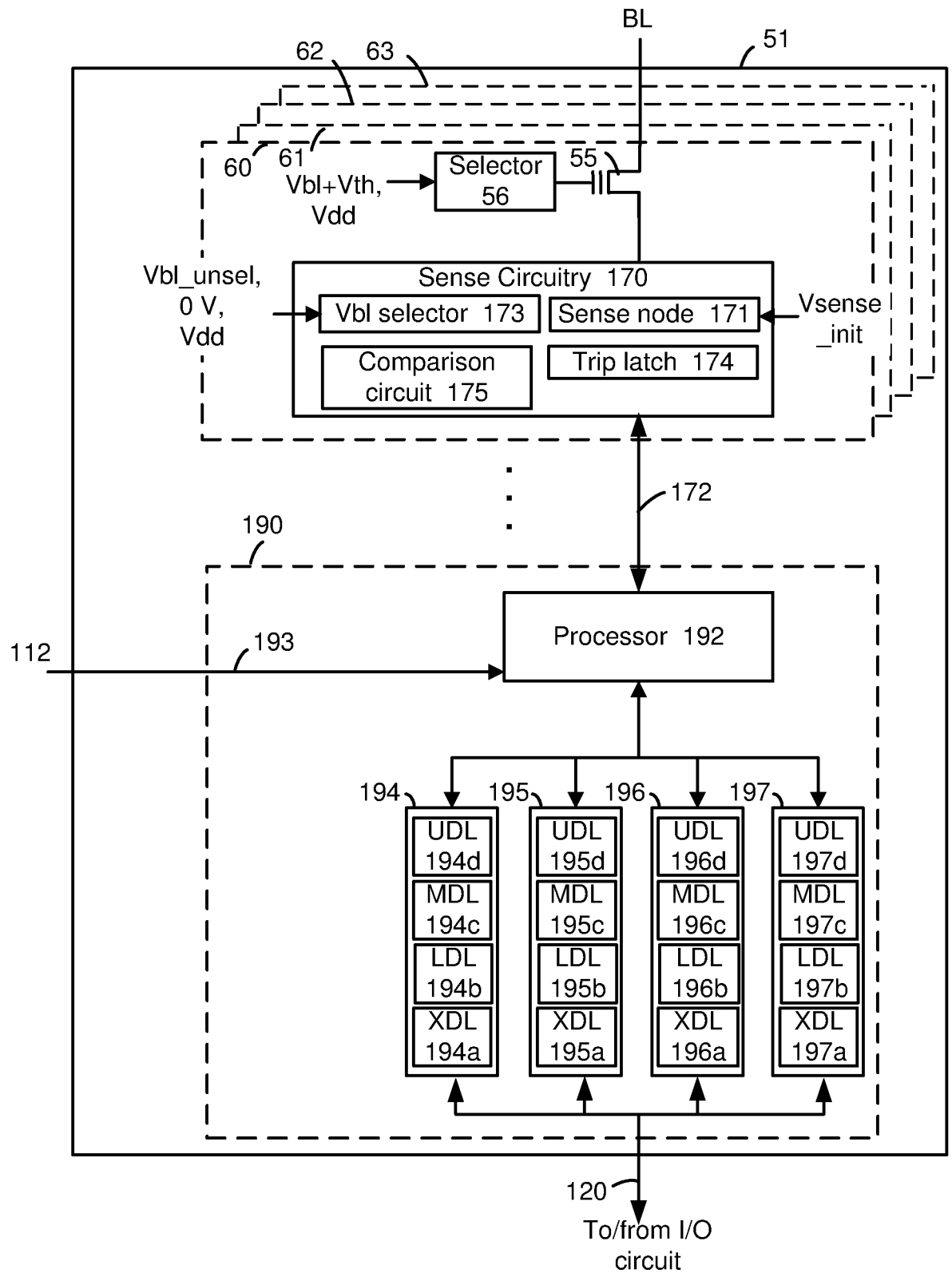
FIG. 1B is a block diagram depicting one embodiment of the sense block 51 of FIG. 1.

FIG. 1B is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_unsel (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits.

During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and a data bus 120 to/from an I/O circuit. For each NAND string, a set of data latches can be provided for storing read and write data while an additional input/output latch XDL, or data transfer latch, is provided for transferring data to/from the other latches. The XDL latches may be represented by the latches 512, 513, 522, 523, 532, 533, 542, 543, 552 and 553 of FIGS. 5 and 6A. As mentioned at the outset, these latches can be reduced in size when the data rate is slowed using the techniques described herein, allowing the memory device to be scaled down.

For example, in a three bit per cell embodiment, three data latches LDL, MDL and XDL are provided for storing read and write data for each NAND string. LDL stores a bit for a lower page of data, MDL stores a bit for a middle page of data and UDL stores a bit for an upper page of data. For example, a set of latches 194 includes XDL 194a, LDL 194b, MDL 194c and UDL 194d. A set of latches 195 includes XDL 195a, LDL 195b, MDL 195c and UDL 195d. A set of latches 196 includes XDL 196a, LDL 196b, MDL 196c and UDL 196d. A set of latches 197 includes XDL 197a, LDL 197b, MDL 197c and UDL 197d.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are four data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

FIG. 2A depicts example write data in the latches 194-197 of FIG. 1B in a program operation. In this case, the memory cells each store three bits of data in one of eight data states. At the start of a program operation, the write data can be received at the XDL latch from the controller and I/O circuits and transferred from the XDL latch to the LDL, MDL and UDL latches, for each NAND string. Once the write data is stored in the latches, program pulses can be applied to the selected word line. See also FIG. 8A.

In a read operation, a read voltage is applied to the selected word line while the respective memory cells are sensed to obtain read data. Read data can be transferred from one or more of the LDL, MDL and UDL latches to the XDL latch, and from there to the I/O circuits and the controller, for each NAND string.

Example bit assignments for each state are depicted. A lower, middle or upper bit can represent data of a lower, middle or upper page, respectively. Seven programmed data states A, B, C, D, E, F and G are used in addition to the erased state, Er. With these bit sequences, the data of the lower page can be determined by reading the memory cells using read voltages (e.g., control gate or word line voltages) of VrA and VrE. The lower page (LP) bit=1 if Vth<=VrA or Vth>VrE. LP=0 if VrA<Vth<=VrE. Generally, a memory cell can be sensed by sense circuitry while a read voltage is applied. If the memory cell is in a conductive state, its threshold voltage (Vth) is less than the read voltage. If the memory cell is in a non-conductive state, its Vth is greater than the read voltage.

The read voltages which are used to read a page of data are determined by transitions from 0 to 1 or 1 to 0 in the encoded bits (code word) for each state. For example, the LP bit transitions from 1 to 0 between Er and A, and from 0 to 1 between D and E. Accordingly, the read voltages for the LP are VrA and VrE.

The data of the middle page can be determined by reading the memory cells using read voltages VrB, VrD and VrF. The middle page (MP) bit=1 if Vth<=VrB or VrD<Vth<=VrF. MP=0 if VrB<Vth<=VrD or Vth>VrF. For example, referring to the encoded bits of FIG. 2B, the MP bit transitions from 1 to 0 between A and B, from 0 to 1 between C and D, and from 1 to between E and F. Accordingly, the read voltages for the MP are VrB, VrD and VrF.

The data of the upper page can be determined by reading the memory cells using read voltages of VrC and VrG. The upper page (UP) bit=1 if Vth<=VrC or Vth>VrG. UP=0 if VrC<Vth<=VrG. For example, referring to the encoded bits of FIG. 2B, the UP bit transitions from 1 to 0 between B and C, and from 0 to 1 between F and G. Accordingly, the read voltages for the UP are VrC and VrG.

A read operation can involve reading one page at a time. See also FIG. 8C. In this case, the read data for a page is obtained by the sense circuits and stored in the XDL latches for output to a controller. As described herein, the read data for redundant columns can be buffered in a FIFO buffer before being transferred to the controller.

FIG. 2B depicts a threshold voltage (Vth) distribution of a set of memory cells, using eight data states, consistent with FIG. 2A. The Vth distribution is achieved after performing a program operation. In one approach, the program operation may use incremental step pulse programming During the programming, program-verify iterations are performed for a selected word line. A program-verify iteration comprises a program portion in which a program voltage is applied to the word line followed by a verify portion in which one or more verify tests are performed. Each programmed state has a verify voltage which is used in the verify test for the state. For example, the verify voltages of the A, B, C, D, E, F and G states are VvA, VvB, VvC, VvD, VvE, VvF and VvG, respectively. The A, B, C, D, E, F and G states are represented by the Vth distributions 201, 202, 203, 204, 205, 206 and 207, respectively, and an example encoding of bits for each state is 111, 110, 100, 000, 010, 011, 001 and 101, respectively, in the format of UPIMPILP. The read voltages VrA, VrB, VrC, VrD, VrE, VrF and VrG, consistent with FIG. 2A, are also depicted.

Figure 3:
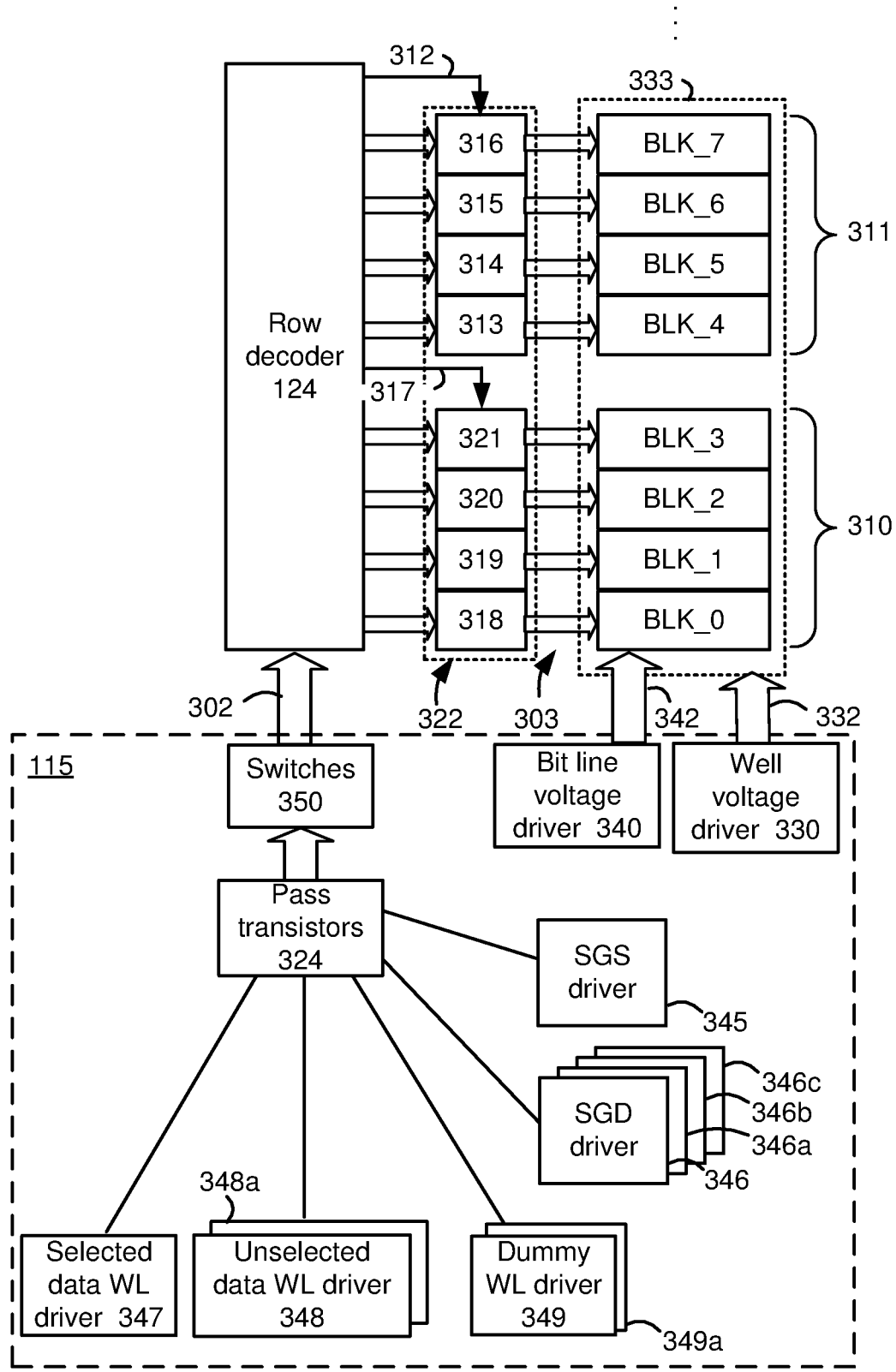
FIG. 3 depicts an example implementation of the power control module 115 of FIG. 1A for providing voltages to blocks of memory cells.

FIG. 3 depicts an example implementation of the power control module 115 of FIG. 1A for providing voltages to blocks of memory cells. In this example, the memory structure 126 includes a set 310 of four related blocks, BLK_0 to BLK_3, and another set 311 of four related blocks, BLK_4 to BLK_7. The blocks can be in one or more planes. The row decoder 124 of FIG. 1A provides voltages to word lines and select gates of each block via pass transistors 322. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313, 314, 315 and 316, which in turn are connected to control gate lines of BLK_4, BLK_5, BLK_6 and BLK_7, respectively. A control gate line 317 is connected to sets of pass transistors 318, 319, 320 and 321, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

The voltage drivers can include a selected data word line (WL) driver 347, which provides a voltage on a data word line selected during a program or read operation. The driver 347 can provide a voltage on WLn. Drivers 348, 348a, 348b and 348c can be used for unselected data word lines, and dummy word line drivers 349 and 349a can be used to provide voltages on dummy word lines WLDD and WLDS, respectively, in FIG. 4. For example, the driver 348 can be used to apply voltages to the drain-side unselected word lines and the driver 348a can be used to apply voltages to the source-side unselected word lines.

The voltage drivers can also include separate SGD drivers for each sub-block. For example, SGD drivers 346, 346a, 346b and 346c can be provided for SB0, SB1, SB2 and SB3, respectively, such as in FIG. 4. In one option, an SGS driver 345 is common to the different sub-blocks in a block.

The various components, including the row decoder, may receive commands from a controller such as the state machine 112 or the controller 122 to perform the functions described herein.

The well voltage driver 330 provides a voltage Vsl to a well region 333 in the substrate, via control lines 332. The well voltage driver 330 is one example of a source line driver, where the well region is a source line, e.g., a conductive path connected to the source ends of the NAND strings. In one approach, the well region is common to the blocks. A set of bit lines 342 is also shared by the blocks. A bit line voltage driver 340 provides voltages to the bit lines. In a stacked memory device sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

FIG. 4 depicts an example view of NAND strings in a block BLK0 in the memory structure 126 of FIG. 1. A block comprises a plurality of memory cells. The primary NAND strings are arranged in sub-blocks of the block in a 3D configuration. Each sub-block includes multiple NAND strings, where one example NAND string is depicted. For example, SB0, SB1, SB2 and SB3 comprise example NAND strings 400*n*, 410*n*, 420*n* and 430*n*, respectively. The NAND strings have data word lines, dummy word lines and select gate lines. Each sub-block comprises a set of NAND strings which extend in the x direction and which have a common SGD line or control gate layer. The NAND strings 400*n*, 410*n*, 420*n* and 430*n* are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

The NAND strings 400*n*, 410*n*, 420*n* and 430*n* have channels 400*a*, 410*a*, 420*a* and 430*a*, respectively. Additionally, NAND string 400*n* includes SGS transistor 401, dummy memory cell 402, data memory cells 403-414, dummy memory cell 415 and SGD transistor 416. NAND string 410*n* includes SGS transistor 421, dummy memory cell 422, data memory cells 423-434, dummy memory cell 435 and SGD transistor 436. NAND string 420*n* includes SGS transistor 441, dummy memory cell 442, data memory cells 443-454, dummy memory cell 455 and SGD transistor 456. NAND string 430*n* includes SGS transistor 461, dummy memory cell 462, data memory cells 463-474, dummy memory cell 475 and SGD transistor 476.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 5 depicts an example configuration of the block BLK0 of FIG. 4 and associated access circuitry, where the NAND strings are arranged in divisions for primary columns and redundant columns. This is a comparative example which has a problem which is overcome by the configuration of FIG. 6A. Since a block can typically include thousands of NAND strings, it is convenient to divide the block into divisions. Each division in turn includes many columns, where a column is a group of word lines corresponding to a unit of data such as a word. For example, with a 16-bit word, there are 16 NAND strings in a column. The block can be divided into primary columns 500 and redundant columns 501. A primary column is a column which does not replace a defective column but is intended to be used to store data as long as it is not defective. A redundant column replaces a defective primary column. See also FIGS. 6E and 6F. A primary column can be deemed defective if one or more of its NAND strings are defective, in one approach. The number of redundant columns is much less than the number of primary columns, e.g., <1% of the number of primary columns. Moreover, the portion of all columns in a block which are allocated as redundant columns is expected to decrease as memory devices are further scaled.

In this example, there are four divisions of primary columns, Div0P-Div3P, and two divisions of redundant columns, Div0R and Div1R. The number of columns per division is much less for the redundant column divisions than for the primary column divisions. As a result, the input/output circuits for the redundant column divisions can have a lower degree of parallelism than the input/output circuits for the primary column divisions. In other words, there is a shorter pipeline for the input/output circuits for the redundant column divisions than for the input/output circuits for the primary column divisions.

The parallelism of the primary column divisions is represented by two levels of input/output circuits, including a first level L1 and a second level L2, in this example. For the primary columns, the first level includes a first set of input/output circuits 516, 526, 536 and 546, with one input/output circuit per division, and the second level includes a second set of input/output circuits 514, 515, 524, 525, 534, 535, 544 and 545, with two input/output circuits per division. This is an example of a pipeline in which two units of data are received by one L1 input/output circuit are transferred to two L2 input/output circuits, one unit per L2 input/output circuit. That is, one half of the data is handled by one L2 input/output circuit and the other half is handled by another L2 input/output circuit. A further parallelism occurs in the L2 latches, such as depicted in FIG. 6B. In other examples, the primary column divisions have more than two levels of input/output circuits.

Each L2 I/O circuit is associated with, and connected to, a set of input/output latches such as the XDL latches discussed previously. For example, the L2 input/output circuits 514, 515, 524, 525, 534, 535, 544 and 545 are associated with sets of latches 512, 513, 522, 523, 532, 533, 542 and 543, respectively, which in turn are associated with, and connected to, sets of sense circuits 510, 511, 520, 521, 530, 531, 540 and 541, respectively.

The L1 I/O circuits are connected to the L2 I/O circuits via paths such as data buses. For example, the L1 I/O circuit 516 is connected to the L2 I/O circuits 514 and 515 via paths 503 and 503*a*, respectively.

The L2 I/O circuits are connected to the latches via paths such as buses. For example, the L2 I/O circuit 514 is connected to the latches 512 via a path 504.

The latches are connected to the sense circuits via paths such as buses. For example, the latches 512 are connected to the sense circuits 510 via a path 505.

The sense circuits are connected to the NAND strings of a division via bit lines. For example, the sense circuits 510 are connected to the NAND strings of Div0P via bit lines 506.

The L1 I/O circuits and L2 I/O circuits may include hardware, software and/or firmware for performing the processes described herein. For example, in a program operation, the L1 I/O circuit 516 may have circuitry for receiving e.g., two words or four bytes of write data, from the controller 122 via a bus 502 at a first data rate R1, and transferring, in parallel, a first word to the L2 I/O circuit 514 and a second word to the L2 I/O circuit 515 at a second data rate R2 which is less than the first data rate. For example, the second data rate may be one half of the first data rate. The data rate of an I/O circuit can be set by using a corresponding clock signal to transfer data. The L2 I/O circuit 514 may have circuitry, such as a multiplexer/demultiplexer, for receiving a word of write data from the L1 I/O circuit via a path 503 at the first data rate, and transferring bits of the word to respective latches in the set of latches 512 at the second data rate.

As described in FIG. 7A, for example, the transfer of the words at the lower data rate from an L1 I/O circuit to multiple L2 I/O circuits for a division can occur while the L1 I/O circuits of other divisions receive data. In a program operation, the write data can be distributed in a round robin manner, with one portion of write data per division. After each division has received a portion of write data from the controller, the next division is selected and so on, in repeated cycles.

In a read operation, the L2 I/O circuits for a division transfer read data from the sense circuits to the associated L1 I/O circuit at the lower, second data rate. The L1 I/O circuit then transfers the read data to the controller via the bus at the higher, first data rate.

This approach allows the controller to exchange data with the high level L1 I/O circuits at a relatively high speed while the transfer speed can be reduced within the lower level circuitry such as the latches, which is closer to the memory cells, to allow the use of scaled down components.

In a read operation, the read data can be transferred from the sense circuits to the L1 I/O circuits in a round robin manner, with one unit per division. After each division has transferred a unit of read data to the controller, the next division is selected and so on, in repeated cycles.

The input/output circuits of the redundant column divisions are represented by a first level L1. The first level includes a first set of L1 input/output circuits 554 and 555, with one input/output circuit per division. A further parallelism occurs in the L1 latches, such as depicted in FIG. 6C. In other examples, the redundant column divisions have more than one level of input/output circuits. Generally, the redundant column divisions have fewer levels of input/output circuits than the primary column divisions since the redundant column divisions are much smaller, as mentioned.

In a program operation, the L1 I/O circuit 555 may have circuitry, such as a such as a multiplexer/demultiplexer, for receiving, e.g., two words or four bytes of write data, from the controller 122 via the bus 502 and transferring the data to the latches 553. However, the transfer occurs at the higher, first data rate since the L2 I/O circuits are not used. As a result, the required size of the latches of the redundant divisions is greater than the required size of the latches of the primary divisions, to tolerate the higher data rate. This represents a critical path in the memory device. Further, for uniformity in the fabrication process, the latches of the primary divisions are typically upsized to match the size of the latches of the redundant divisions. This consumes space unnecessarily and prevents scaling of the layout.

In a read operation, the L1 I/O circuits for a division transfer read data from the latches to the controller via the bus at the higher, first data rate.

The L1 I/O circuits are connected to the latches via paths such as buses. For example, the L1 I/O circuit 555 is connected to the latches 553 via a path 507.

The latches are connected to the sense circuits via paths such as buses. For example, the latches 552 are connected to the sense circuits 550, and the latches 553 are connected to the sense circuits 551 via a path 508.

The sense circuits are connected to the NAND strings of a division via bit lines. For example, the sense circuits 551 are connected to the NAND strings of Div0R via bit lines 509.

FIG. 6A depicts another example configuration of the block BLK0 of FIG. 4 and associated access circuitry 570, where the NAND strings are arranged in divisions for primary columns and redundant columns, and where the associated access circuitry includes a set of first-in, first-out (FIFO) buffers 149 for the redundant columns. The set of FIFO buffers 149 includes FIFO buffers 150 and 160 for Div0R and Div0R, respectively. The FIFO buffers may be connected to the controller 122 via the bus 502 to exchange data with the controller, and to the L1 I/O circuits 554 and 555 via buses 560 and 561, respectively, to exchange data with the sets of latches 552 and 553, respectively. The FIFO buffers may also have a communication path 562 to the controller to receive control signals and provide feedback. For example, a FIFO buffer may inform the controller of when it has completed transferring data to latches of the redundant columns, and when it has started and completed a prefetch process in a read operation. A clock signal generator 151 can be used to provide one or more clock signals to the FIFO buffers to control their data rates.

A FIFO buffer can be provided for each redundant column division. The FIFO buffer has multiple entries which each store a word of data, for example. See also FIG. 6D. The FIFO buffer serves as an interface between the latches and the controller 122 and bus 502, and allows a lower data rate to be used when exchanging data with the latches compared to exchanging data with the controller. The FIFO buffer can also provide the flexibility to transfer write data to the latches for the redundant columns at one data rate and receive read data from the latches for the redundant columns at another data rate.

Further, the FIFO buffer allows multiple words (or other units) of data to be temporarily held (buffered) and to transfer words (or other units) of data one at a time to either the latches in a program operation, or to the controller in a read operation.

FIG. 6B depicts an example configuration of the L1 I/O circuit 516 and the associated L2 I/O circuits 514 and 515 for the primary columns of Div0P of FIG. 6A. The L2 I/O circuit 514 comprises two sets of components referred to a YUNIT. A first set of YUNITS 610 includes an example YUNIT 610a. A second set of YUNITs 611 is also shown. Each YUNIT is connected to latches of multiple NAND strings. The first and second sets of YUNITs communicate with the L1 I/O circuit 516 via the path 503. The L2 I/O circuit 515 similarly comprises first and second sets of YUNITs 620 and 621, respectively, which communicate with the L1 I/O circuit 516 via the path 503a. In another approach, more than two sets of YUNITs are used for each L2 I/O circuit.

FIG. 6C depicts an example configuration of the L1 I/O circuit 554 and the associated FIFO buffer 150 for the redundant columns of Div0R of FIG. 6A. The L1 I/O circuit 554 comprises one set of YUNIT circuits, for example, which has fewer YUNIT circuits than the L1 I/O circuits 514 and 515 for the primary column divisions. An example YUNIT circuit 554a is depicted. As mentioned, the number of redundant columns is much less than the number of primary column so that the access circuitry is less complex. The set of YUNITs communicate with the FIFO buffer 150 via the bus 560.

FIG. 6D depicts an example configuration of FIFO buffers 150 and 160. A FIFO buffer can be sized to store a number of words which is less than the capacity of a row of memory cells of the redundant column division, in one approach. In this example, a column division such as Div0R or Div1R stores eight words, and the FIFO buffers 150 or 160 each store four words. This helps minimize the size of the buffer while still allowing it to store a few words for the purpose of changing the data rate in which the words are transferred, and while minimizing a time penalty in a program or read operation. The optimal size of the FIFO buffer can be based on factors such as the expected maximum number of consecutive bad primary columns. The size should be greater when this number is greater.

The buffer 150 includes entries 151, 152, 153 and 154, and the buffer 160 includes entries 161, 162, 163 and 164. Each buffer can be implemented as a circular buffer with a pointer, represented by arrows 155 and 165. The pointer points at one of the entries which is the next entry to be written to, or read from. For example, for writing data to the buffer 150, the entry 151 may be written first. The pointer is then moved to entry 152, which is the next entry to be written, while the data in the entry 151 is maintained. The pointer is then moved to entry 153, which is the next entry to be written, while the data in the entries 151 and 152 are maintained. The pointer is then moved to entry 154, which is the next entry to be written, while the data in the entries 151-153 is maintained. The pointer is then moved back to entry 151, which is the next entry to be written, while the data in the entries 152-154 is maintained, and so on. The previous data in the entry 151 is overwritten. The data can be read out of the buffer when all of the entries have been written to, e.g., the buffer is full, or when a specified number of entries (fewer than all entries) have been written to.

For reading data from the buffer 150, assuming data is stored in each entry, the entry 151 may be read first. The pointer is then moved to entry 152, which is the next entry to be read, while the data in the entry 151 is maintained. The pointer is then moved to entry 153, which is the next entry to be read, while the data in the entries 151 and 152 are maintained. The pointer is then moved to entry 154, which is the next entry to be read, while the data in the entries 151-153 is maintained. The pointer is then moved back to entry 151, which is the next entry to be read, while the data in the entries 152-154 is maintained, and so on.

Generally, the first-in, first-out buffer is configured to store a number M entries, each entry storing a column of data of the redundant columns and, in a read operation involving the block of memory cells, transfer out one entry of the M entries to a controller via the bus to replace one bad column among the primary columns. M is an integer of two or more.

During a program operation, when a redundant column is selected to store write data in place of a defective primary column, the write data can be received at the FIFO at the relatively high data rate used by the controller to transmit write data on the bus 502, stored temporarily in the FIFO buffer, and then transferred from the FIFO buffer to the latches for the redundant column at a relatively low data rate. This transferring can be asynchronous to the transferring of data to the latches of the primary columns. This provides flexibility to transfer the write data from the FIFO buffer to the latches for the redundant column at an optimal time and data rate. In one approach, write data for a single redundant column can be transferred to the latches without waiting for write data of a next redundant column. In fact, the FIFO buffer may not know how many columns of write data it will receive in the course of a program operation for a selected word line of a block.

In another approach, the FIFO buffer can wait until all of its entries are full with write data for redundant columns before transferring the write data to the latches. This transferring of the write data frees the FIFO buffer to accept additional write data. In another approach, the FIFO buffer can wait until a specified number of entries (e.g., fewer than all entries) have been written to with write data before transferring the write data to the latches. In another approach, if the FIFO buffer does not become full with write data, the FIFO buffer can wait until the controller has completed transferring all of the write data for the program operation to the primary columns before the FIFO buffer transfers the write data to the latches of the redundant columns. For example, the FIFO buffer can receive a control signal via the path 562 from the controller indicating that the controller has completed transferring all of the write data.

During a read operation, the FIFO buffer can be partially or fully filled with read data from multiple redundant columns, in a prefetch process. This can occur before the primary columns begin to transfer out their read data to the controller. This approach ensures that the FIFO buffer has read data ready to transfer to the controller in case of a defective primary column. In some cases, the FIFO buffer entries contain null read data from redundant columns which do replace defective columns. For example, in the FIFO buffer 150, the entries 151-154 may store read data from columns C0-C3, respectively, in Div0R. These are the first redundant columns in Div0R. The read data from C0 and C1 is real when these columns replace corresponding defective primary columns, while the read data from C2 and C3 is null when these columns do not replace corresponding defective primary columns.

Subsequently, when read data is transferred from entries of the FIFO buffer to the controller, the transferred entries can be filled with additional read data from the redundant columns Generally, the read data can be transferred to the FIFO buffer from the latches of the redundant columns at a relatively low data rate, stored temporarily in the FIFO buffer, and then transferred from the FIFO buffer to the controller via the bus 502 at a relatively high data rate. The transfer from the latches of the redundant columns to the FIFO buffer can be asynchronous to the transferring of data from the latches of the primary columns to the controller. This provides flexibility to transfer the read data to the FIFO buffer from the latches for the redundant columns at an optimal time and data rate.

In one approach, all of the entries of the FIFO buffer are filled in the prefetch process, at the start of a read operation. See FIGS. 11A and 12A. When read data from one entry is transferred out of the FIFO buffer to the controller, data from a next redundant column can be read in to replace that entry. In this way, the FIFO buffer remains full with read data. In another approach, new read data is not transferred into the FIFO buffer until read data from a specified number of one or more entries have been transferred out. In another approach, new read data is not transferred into the FIFO buffer until read data from all of its entries have been transferred out.

FIG. 6E depicts example primary columns in the divisions Div0P-Div3P of FIG. 6A. As mentioned, each division can be arranged in columns, where a column comprises a number of NAND strings equal to the number of bits in a word of data, in one approach. Moreover, the divisions for the primary data include a significantly larger number of columns than the divisions for the redundant data. In this example, Div0P includes columns 630-634 and a region 635 comprises a remainder of the columns in the division.

Similar, Div1P includes columns 640-644 and a region 645 comprises a remainder of the columns in the division. Div2P includes columns 650-654 and a region 655 comprises a remainder of the columns in the division. Div3P includes columns 660-664 and a region 665 comprises a remainder of the columns in the division.

FIG. 6F depicts example redundant columns in the divisions Div0R and Div1R of FIG. 6A. In this example, Div0R includes columns C0-C7, and Div1R includes columns C8-C15. Each division has eight columns in this example. In one approach, the redundant columns are selected to replace defective primary columns in a round robin manner. For example, C0 is selected, followed by C8, C1, C9 and so forth. One redundant column is selected from a division before selecting a column from the next division. The subsequent examples follow this approach. This approach is efficient because it allows data to be transferred to or from the latches of multiple divisions at least partly in parallel. In another approach, all of the redundant columns are selected from a division before moving to a next division. For example, C0-C7 can be selected before selecting C8-C15.

FIG. 6G depicts an example assignment of words to the columns in FIG. 6E. In a program or read operation, the words are assigned to the columns in a specified sequence. In this example, the sequence involves the first and second columns of Div0P, Div1P, Div2P and Div3P, then the third and fourth columns of Div0P, Div1P, Div2P and Div3P, and so forth, in successive cycles through the divisions. A first cycle involves W0 and W1 in columns 630 and 631, respectively, W2 and W3 in columns 640 and 641, respectively, W4 and W5 in columns 650 and 651, respectively, and W6 and W7 in columns 660 and 661, respectively. A second cycle involves W8 and W9 in columns 632 and 633, respectively, W10 and W11 in columns 642 and 643, respectively, W12 and W13 in columns 652 and 653, respectively, and W14 and W15 in columns 662 and 663, respectively. This assignment of words is followed in subsequent examples.

FIG. 7A depicts an example timeline in a program operation using the access circuitry of FIG. 5, where there are two bad columns. This is a comparative example which does not use the FIFO buffers 149. In FIGS. 7A, 9A and 10A, time points t0-t12 are shown along a horizontal axis or time line, each block represents a time period in which data is transferred to, from or within the access circuitry, and the blocks are aligned with the horizontal axis to show the time of the transfer.

Further, a row 750 denotes data being input from the controller to the L1 I/O circuits of the primary divisions at a data rate R1, a row 751 denotes data being transferred from the L1 I/O circuits to the latches of the primary divisions via first associated L2 I/O circuits at a second data rate R2<R1, a row 752 denotes data being transferred from the L1 I/O circuits to the latches of the primary divisions via second associated L2 I/O circuits at the second data rate, and a row 753 denotes data being transferred from the controller to the L1 I/O circuits of the redundant divisions at a data rate RE For example, for the L1 I/O circuits 516, 526, 536 and 546, the first associated L2 I/O circuits are the L2 I/O circuits 514, 524, 534 and 544, respectively, and the second associated L2 I/O circuits are the L2 I/O circuits 515, 525, 535 and 545, respectively.

W0-W11 are successive words of write data which are transferred from the controller to the latches. Also in this example, the table 147 of in FIG. 7B indicates that W6 and W8 should be written to redundant columns C0 and C8 because the associated primary columns 660 and 632, respectively, are defective. Referring to the row 750, the L1 I/O circuit 516 receives W0 (block 700) and W1 (block 701) at t0-t1 and t1-t2, respectively. The L1 I/O circuit 526 receives W2 (block 702) and W3 (block 703) at t2-t3 and t3-t4, respectively. The L1 I/O circuit 536 receives W4 (block 704) and W5 (block 705) at t4-t5 and t5-t6, respectively. Next, instead of being received by the L1 I/O circuit 546 of Div3P, W6 (block 706) is addressed to C0 and is received by the L1 I/O circuit 554 of Div0R at t6-t7 (row 753) and routed directly to the latches 552. Next, the L1 I/O circuit 546 receives W7 (block 707) at t7-t8. Next, instead of being received by the L1 I/O circuit 516 of Div0P, W8 (block 708) is addressed to C8 and is received by the L1 I/O circuit 555 of Div0R at t8-t9 (row 753) and routed directly to the latches 553. Next, the L1 I/O circuit 516 receives W9 (block 709) at t9-t10. Next, the L1 I/O circuit 526 receives W10 (block 710) and W11 (block 711) at t10-t11 and t11-t12, respectively. The process can continue for additional words.

For the primary divisions, the data received by the L1 I/O circuits at a data rate R1 can be transferred to the latches at the lower data rate R2. Moreover, this can be done while additional words are received at the L1 I/O circuits. For example, row 751 shows that W0 (block 700a), W2 (block 702a) and W4 (block 704a) are transferred to the latches at t2-t4, t4-t6 and t6-t8, respectively. Similarly, row 752 shows that W1 (block 701a), W3 (block 703a), W5 (block 705a), W7 (block 707a) and W9 (block 709a) are transferred to the latches at t2-t4, t4-t6, t6-t8, t8-t10 and t10-t12, respectively. Generally, an L1 I/O circuit for the primary columns can operate in a receive mode in which it receives two words of data, then transition to a transmit mode in which it transmits the data to the L2 I/O circuits.

However, since W6 and W8 are transferred to the latches of the redundant divisions at the higher data rate, the above-mentioned issues arise.

Figure 8B:
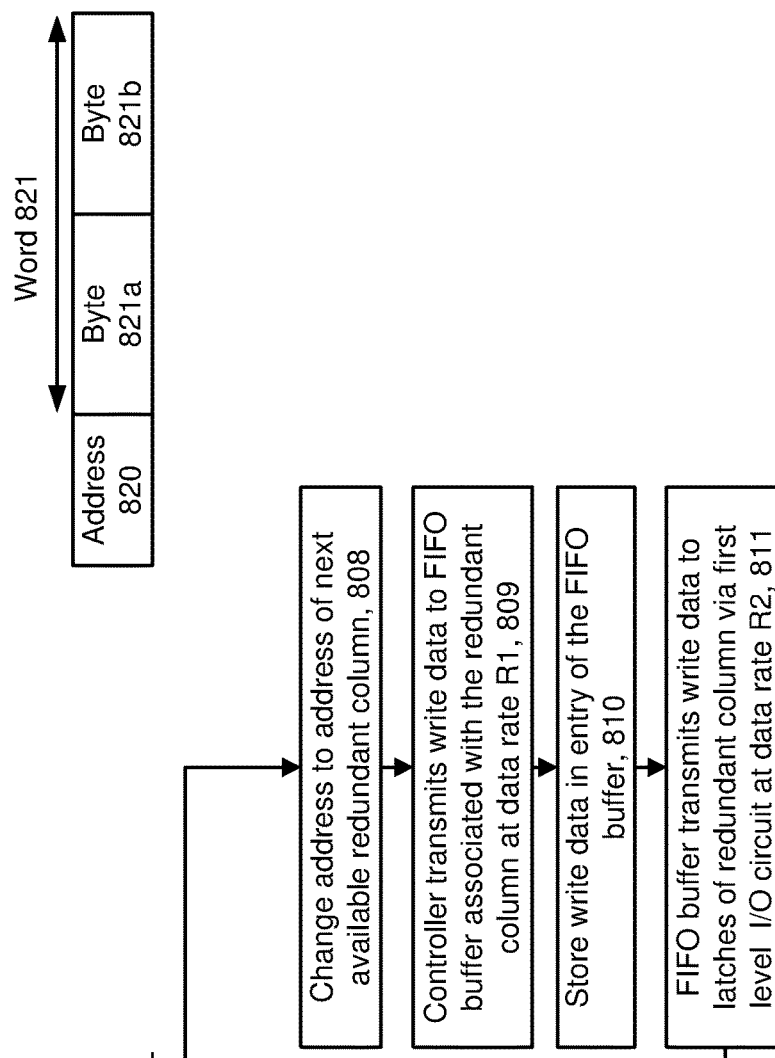
FIG. 8B depicts an example address and word consistent with the process of FIG. 8A.

FIG. 7B depicts an example of the column replacement table 147 of FIG. 1, consistent with FIG. 7A. The table indicates that primary columns (col.) 632 and 660 which are normally expected to store W8 and W6, respectively, in the absence of a defect, are replaced by the redundant columns C8 and C0, respectively. The primary column 632 would normally store W8 after the primary column 660 stores W6, due to the cyclical passes through the divisions, consistent with FIG. 6G. The table may identify the columns by respective addresses, where, in a program operation, write data transmitted by the controller also includes a respective address 820 (FIG. 8B). The controller can compare the address of each unit of write data it is transmitting to the addresses in the table 147. If there is a match, the original address is replaced by an address of a next available redundant column.

Similarly, in a read operation, the controller can issue a command to read data from a column address. The controller can compare the address of each unit of read data it is requesting to the addresses in the table 147. If there is a match, the original address is replaced by an address of a next available redundant column.

Figure 8A:
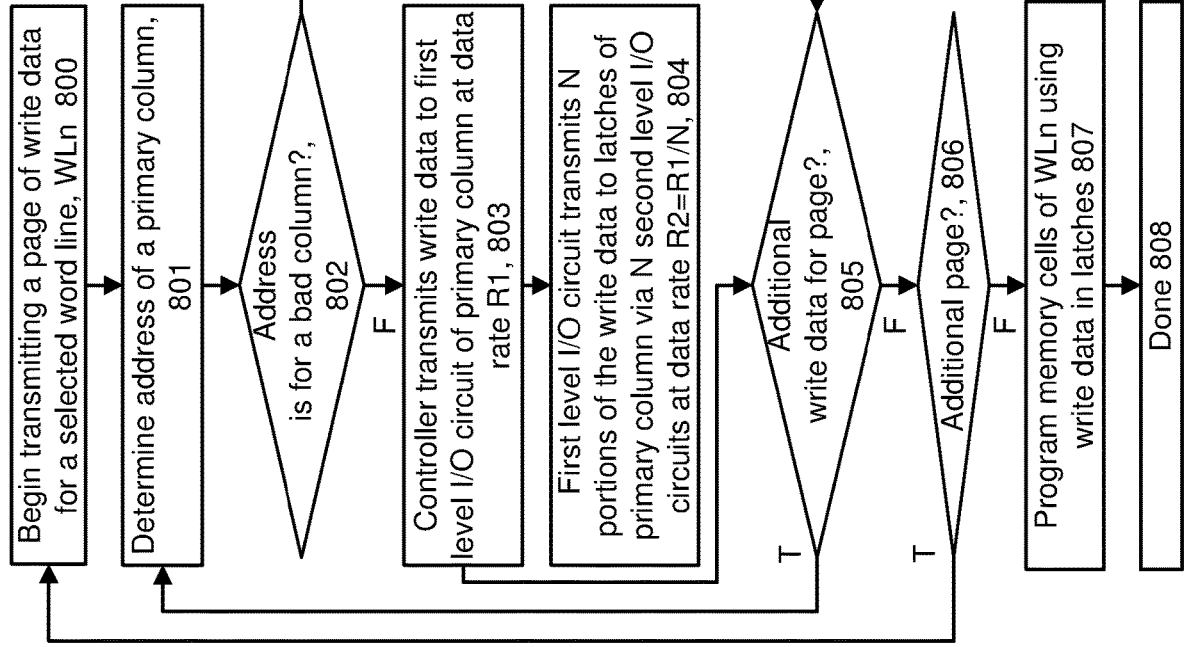
FIG. 8A depicts an example program operation consistent with the configuration of FIG. 6A.

FIG. 8A depicts an example program operation consistent with the configuration of FIG. 6A. A program operation can involve one or more pages of data. In one approach, the write data is transmitted from the controller to the latches one page at a time. Step 800 begins transmitting a page of write data for a selected word line WLn. Step 801 determines an address of a primary column, e.g., where a current unit (e.g., word) of write data is to be transferred. See also FIG. 6G. For example, first and second units can be addressed to the first and second columns, 630 and 631, respectively, of the first primary column division Div0P. See also FIG. 6E. Third and fourth units can be addressed to first and second columns 640 and 641, respectively, of the second primary column division Div1P. Fifth and sixth units can be addressed to the first and second columns 650 and 651, respectively, of the third primary column division Div2P. Seventh and eighth units can be addressed to first and second columns 660 and 661, respectively, of the fourth primary column division Div3P. Subsequently, the data is addressed to the third and fourth columns of each primary division, e.g., columns 632 and 633 in Div0P, columns 642 and 643 in Div1P, columns 652 and 653 in Div2P, and columns 662 and 663 in DIv3P, and so forth in a cyclical manner.

A decision step 802 determines if the current address is for a bad column. This step may be true, e.g., if the address is in the column replacement table. In this case, step 808 changes the address to the address of the next available redundant column At step 809, the controller transmits the write data to the FIFO buffer associated with the redundant columns at a relatively high data rate R1. Step 810 stores the write data in an entry of the FIFO buffer. At step 811, the FIFO buffer transmits the write data to the latches of the redundant column via the first level I/O circuits at a relatively low data rate R2<R1. The data rate can be expressed in terms of bits per second, for example, and is a function of a clock rate of a signal used by the FIFO buffer to transmit the data.

If the decision step 802 is false, the current address is not for a bad column, and step 803 is reached, where the controller transmits the write data to the first level I/O circuit of the primary column at the data rate R1. At step 804, the first level I/O circuit transmits N portions of the write data to the latches of the primary columns via N second level I/O circuits at the data rate R2=R1/N, where N is an integer of two or more. For example, N=2 in the configuration of FIG. 6A. Note that the data rate R2 is used in steps 804 and 811 as an example, but these data rates can differ from one another. As mentioned, the FIFO buffer has the flexibility to output data at a rate which is independent of the rate used at step 804.

While step 804 is performed, processing can continue at decision step 805, which determines if there is additional write data to transmit for the current page. If decision step 805 is true, step 801 is reached to determine an address of a next primary column. If decision step 805 is false, a decision step 806 is reached. Decision step 806 determines if there is a next page of write data to transmit. If decision step 806 is true, step 800 is reached to begin transmitting the next page of write data. If decision step 806 is false, all of the write data for the one or more pages is in place in the latches. This include latches for the non-defective primary columns and latches for the redundant columns which are used to replace defective primary columns Step 807 includes programming the memory cells of WLn using the write data in the latches. This includes programming memory cells in the non-defective primary columns and the redundant columns which are used to replace defective primary columns. For example, incremental step pulse programming may be used. The program operation is done at step 808.

FIG. 8B depicts an example address 820 and unit of write data consistent with the process of FIG. 8A. For example, a word 821 of data may comprise bytes 821a and 821b. In one approach, as mentioned, two successive units of write data are transmitted to an L1 I/O circuit of the primary column divisions. The address can be expressed as an offset from a reference address for efficiency.

Figure 8C:
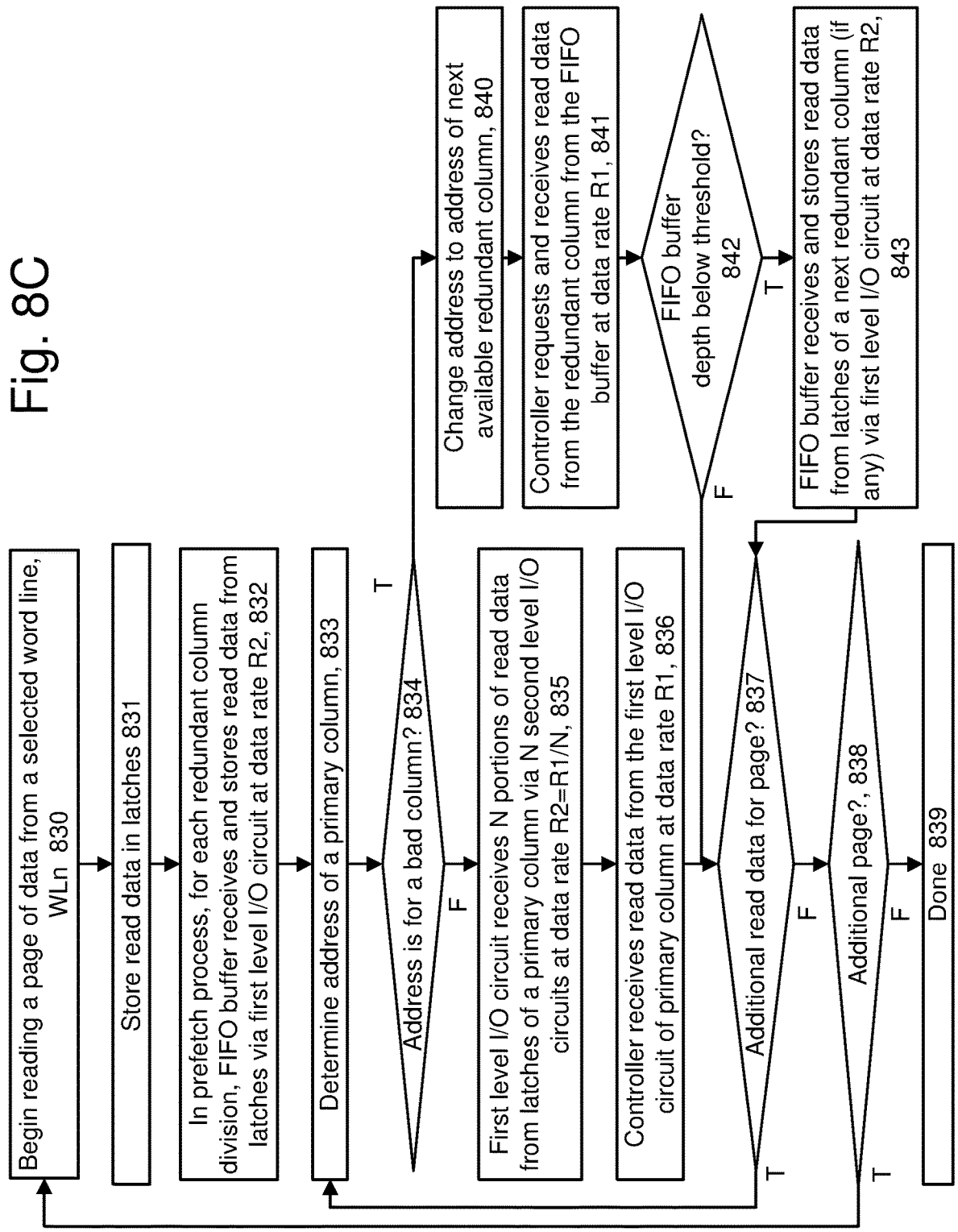
FIG. 8C depicts an example read operation consistent with the configuration of FIG. 6A.

FIG. 8C depicts an example read operation consistent with the configuration of FIG. 6A. Step 830 begins reading a page of data from the memory cells of a selected word line. This includes reading memory cells in the primary columns and the redundant columns Step 831 includes storing the read data in latches, e.g., latches 512, 513, 522, 523, 532, 533, 542, 543, 552 and 553 of FIG. 6A. At step 832, in a prefetch process, for each redundant column division, the associated FIFO buffer receives and stores read data from the latches via the first level I/O circuits at a date rate R2. That is, the first-in, first-out buffer, in a read operation involving the block of memory cells, is configured to prefetch data from multiple columns of the redundant columns from the input/output circuits for the redundant columns, prior to data of the primary columns being output to the controller via the input/output circuits for the primary columns.

As mentioned, some or all of the entries in the FIFO buffers can be filled with read data from the redundant columns in the prefetch process. This process makes the data readily available for readout by the controller. At step 833, the controller, for example, determines an address of a column primary to read.

A decision step 834 determines if the current address is for a bad column. This step is true if the address is in the column replacement table. In this case, step 840 changes the address to the address of the next available redundant column. At step 841, the controller requests and receives read data from the redundant column from the FIFO buffer at the data rate RE A decision step 842 determines if the FIFO buffer depth, e.g., the number of entries which have not yet been read out of the FIFO buffer, is below a threshold. If the decision step is true, at step 843, the FIFO buffer receives and stores read data from latches of a next redundant column (if any) via the first level I/O circuit at the data rate R2. That is, if the read data has already been read into the FIFO buffer for each redundant column of the redundant column division, there is no additional data to read into the FIFO buffer.

If the decision step 842 is false, the decision step 837 is reached. The decision step 837 is also reached after step 843. The decision step 837 determines if there is additional read data for the current page, to be read in by the controller. If decision step 837 is true, step 833 is reached to determine an address of a next primary column. If decision step 837 is false, a decision step 838 is reached. Decision step 838 determines if there is a next page of data to read. If decision step 838 is true, step 830 is reached to begin reading the next page of data. If decision step 838 is false, all of the read data has been obtained by the controller, including read data from the non-defective primary columns and the redundant columns which are being used to replace defective primary columns. The read operation is done at step 839.

If the decision step 834 is false, step 835 is reached, where a first level I/O circuit receives N portions of read data from latches of a primary column via N second level I/O circuits at a data rate R2=R1/N, for instance. For example, the N portions can be two words of data, one from each second level I/O circuit, consistent with FIG. 6A. At step 836, the controller receives read data from the first level I/O circuit of the primary column at a data rate RE Decision step 837, discussed above, is then reached.

FIG. 9A depicts an example timeline in a program operation using the access circuitry of FIG. 6A, consistent with the process of FIG. 8A, where there is one bad column. This example uses the FIFO buffers 149. A row 950 denotes data being input from the controller to the L1 I/O circuits of the primary divisions at a data rate R1, a row 951 denotes data being transferred from the L1 I/O circuits to the latches of the primary divisions via first associated L2 I/O circuits at a second data rate R2<R1, a row 952 denotes data being transferred from the L1 I/O circuits to the latches of the primary divisions via second associated L2 I/O circuits at the second data rate, a row 953 denotes data being transferred from the controller to the FIFO buffer 150 of the redundant division Div0R at a data rate R1, and a row 954 denotes data being transferred from the FIFO buffer to the latches of the redundant division at a data rate R2.

W0-W11 are successive words of write data which are transferred from the controller to the latches. Also in this example, the table 147 of in FIG. 9B indicates that the column 660 of Div3P is defective and that the corresponding word W6 should be written to the redundant column C0 instead. Referring to the row 950, the L1 I/O circuit 516 receives W0 (block 700) and W1 (block 701) at t0-t1 and t1-t2, respectively. The L1 I/O circuit 526 receives W2 (block 702) and W3 (block 703) at t2-t3 and t3-t4, respectively. The L1 I/O circuit 536 receives W4 (block 704) and W5 (block 705) at t4-t5 and t5-t6, respectively. Next, instead of being received by the L1 I/O circuit 546 of Div3P, W6 (block 706) is addressed to C0 and is received by the FIFO buffer 150 of Div0R at t6-t7 (row 953) at the data rate RE Next, the L1 I/O circuit 546 receives W7 (block 707) at t7-t8. Further, in this example, W6 (block 706a) is transferred from the FIFO buffer to the latches of C0 at the data rate R2 from t7-t9.

The L1 I/O circuit 516 receives W8 (block 708) and W9 (block 709) at t8-t9 and t9-t10, respectively. The L1 I/O circuit 526 receives W10 (block 710) and W11 (block 711) at t10-t11 and t11-t12, respectively. The process can continue for additional words.

For the primary divisions, the data received by the L1 I/O circuits at a data rate R1 is transferred to the latches at the lower data rate R2. Moreover, this can be done while additional words are received at the L1 I/O circuits. For example, row 951 shows that W0 (block 700a), W2 (block 702a), W4 (block 704a) and W8 (block 708a) are transferred to the latches at t2-t4, t4-t6, t6-t8 and t10-t12, respectively. Similarly, row 952 shows that W1 (block 701a), W3 (block 703a), W5 (block 705a), W7 (block 707a) and W9 (block 709a) are transferred to the latches at t2-t4, t4-t6, t6-t8, t8-t10 and t10-t12, respectively.

Advantageously, the data is transferred to the latches for the primary and redundant columns at the lower rate R2. Alternatively, as mentioned, the transfer rate for the redundant columns can differ from the transfer rate of the primary columns.

FIG. 9B depicts an example of the column replacement table 147 of FIG. 1, consistent with FIG. 9A. The table indicates that the primary column 660 which is normally expected to store W6 in the absence of a defect, is replaced by C0.

FIG. 9C depicts an example configuration of the FIFO buffer 150 (e.g., of FIG. 6D), consistent with the timeline of FIG. 9A, showing write data W6 for column C0 being stored in the entry 151, which is selected by the pointer. The FIFO buffer has four entries, where each entry can store a word of data, for example. The remaining entries 152-154 do not store data, as denoted by the term "null."

FIG. 9D depicts an example configuration of the FIFO buffer 150 of FIG. 9C, showing the pointer being moved to the entry 152 after the write data W6 is transferred from the entry 151 to the column C0 via the L1 I/O circuit 554 at t7-t9. At t9, the pointer is moved to the entry which follows the entry from which the data was transferred. In this case, if additional write data is stored in the FIFO buffer for another redundant column, it will be stored in the entry 152 based on the position of the pointer.

FIG. 10A depicts an example timeline in a program operation using the access circuitry of FIG. 6A, and consistent with the process of FIG. 8A, where there are two bad columns. This example uses the FIFO buffers 149. The data rate is R1 for rows 1050 and 1053, and R2<R1 for rows 1051, 1052, 1054 and 1055. A row 1050 denotes data being input from the controller to the L1 I/O circuits of the primary divisions, a row 1051 denotes data being transferred from the L1 I/O circuits to the latches of the primary divisions via first associated L2 I/O circuits, a row 1052 denotes data being transferred from the L1 I/O circuits to the latches of the primary divisions via second associated L2 I/O circuits, a row 1053 denotes data being transferred from the controller to the FIFO buffer of a redundant division, a row 1054 denotes data being transferred from the FIFO buffer 150 to the latches of the redundant division Div0R, and a row 1055 denotes data being transferred from the FIFO buffer 160 to the latches of the redundant division Div1R.

W0-W11 are successive words of write data which are transferred from the controller to the latches. Also in this example, the table 147 of in FIG. 10B indicates that the column 660 of Div3P is defective and that the corresponding word W6 should be written to C0 instead. Further, the column 661 of Div3P is defective and the corresponding word W7 should be written to the redundant column C8 instead. The two defective primary columns are adjacent to one another in this example.

Referring to the row 1050, the L1 I/O circuit 516 receives W0 (block 700) and W1 (block 701) at t0-t1 and t1-t2, respectively. The L1 I/O circuit 526 receives W2 (block 702) and W3 (block 703) at t2-t3 and t3-t4, respectively. The L1 I/O circuit 536 receives W4 (block 704) and W5 (block 705) at t4-t5 and t5-t6, respectively. Next, instead of being received by the L1 I/O circuit 546 of Div3P, W6 (block 706) is addressed to C0 and is received by the FIFO buffer 150 of Div0R at t6-t7 (row 1053), and W7 (block 707b) is addressed to C8 and is received by the FIFO buffer 160 of Div0R at t7-t8 (row 1053).

At row 1054, W6 (block 706a) is transferred from the FIFO buffer 150 to the latches of C0 from t7-t9. At row 1055, W7 (block 707b) is transferred from the FIFO buffer 160 to the latches of C8 from t8-t10.

The L1 I/O circuit 516 receives W8 (block 708) and W9 (block 709) at t8-t9 and t9-t10, respectively. The L1 I/O circuit 526 receives W10 (block 710) and W11 (block 711) at t10-t11 and t11-t12, respectively. The process can continue for additional words.

For the primary divisions, the data received by the L1 I/O circuits at a data rate R1 is transferred to the latches at the lower data rate R2. Moreover, this can be done while additional words are received at the L1 I/O circuits. For example, row 1051 shows that W0 (block 700a), W2 (block 702a), W4 (block 704a) and W8 (block 708a) are transferred to the latches at t2-t4, t4-t6, t6-t8 and t10-t12, respectively. Similarly, row 1052 shows that W1 (block 701a), W3 (block 703a), W5 (block 705a) and W9 (block 709a) are transferred to the latches at t2-t4, t4-t6, t6-t8 and t10-t12, respectively.

As in FIG. 9A, the data is transferred to the latches for the primary and redundant columns at the lower rate R2. Alternatively, as mentioned, the transfer rate for the redundant columns can differ from the transfer rate of the primary columns.

FIG. 10B depicts an example of the column replacement table 147 of FIG. 1, consistent with FIG. 10A. The table indicates that the primary column 660 which is normally expected to store W6 in the absence of a defect, is replaced by C0, and the primary column 661 which is normally expected to store W7 in the absence of a defect, is replaced by C8.

FIG. 10C depicts an example configuration of the FIFO buffer 150, consistent with the timeline of FIG. 10A, showing write data W6 for column C0 being stored in entry 151, which is selected by the pointer. The FIFO buffer 150 has four entries, where each entry can store a word of data, for example. The remaining entries 152-154 do not store data, as denoted by the term "null." The pointer can be moved to the entry 152 after W6 is transferred from the FIFO buffer to the associated latches.

FIG. 10D depicts an example configuration of the FIFO buffer 160 (e.g., of FIG. 6D), consistent with the timeline of FIG. 10A, showing write data W7 for column C8 being stored in entry 161, which is selected by the pointer. The FIFO buffer 160 has four entries, where each entry can store a word of data, for example. The remaining entries 162-164 do not store data, as denoted by the term "null." The pointer can be moved to the entry 162 after W7 is transferred from the FIFO buffer to the associated latches.

The examples of FIGS. 9C, 9D, 10C and 10D involve storing one entry of write data before transferring the write data to the latches. In other approaches, as mentioned, more than one entry of write data is stored before transferring all, or some, of the entries to the associated latches.

FIG. 11A depicts an example timeline in a read operation using the access circuitry of FIG. 6A, consistent with the process of FIG. 8C, where there is one bad column. The data rate is R1 for rows 1150 and 1155 and R2<R1 for rows 1151-1154. In FIGS. 11A and 12A, time points t-8 to t12 (including negative value time points t-8 to t-1) are shown along a horizontal axis or time line, each block represents a time period in which data is transferred to, from or within the access circuitry, and the blocks are aligned with the horizontal axis to show the time of the transfer. The time points t-8 to t0 denote a prefetch period. The sensing of the memory cells in the primary and redundant columns, and storing of the read data in the latches, can occur prior to t-8.

In the prefetch period, row 1153 denotes data being transferred from latches of C0 (block 1120), C1 (block 1121), C2 (block 1122) and C3 (block 1123) to the FIFO buffer 150 of the redundant division Div0R, from t-8 to t-6, t-6 to t-4, t-4 to t-2 and t-2 to t0, respectively. Similarly, row 1154 denotes data being transferred from latches of C8 (block 1124), C9 (block 1125), C10 (block 1126) and C11 (block 1127) to the FIFO buffer 160 of the redundant division Div0R, from t-8 to t-6, t-6 to t-4, t-4 to t-2 and t-2 to t0, respectively. In this example, the data of the one bad column is stored in C0, so that block 1120 denotes this usable data being transferred. In contrast, the data read from C1-C3 and C8-C11 is unusable or null data. In this example, both usable and null data are transferred to the FIFO buffer in the prefetch process since the type of the read data is not known in advance, in one approach. In the example of FIG. 12A, the prefetch data is all usable data, and null data is transferred to the FIFO buffers after the prefetch process. In FIGS. 11A and 12A, the dashed line blocks denote null read data.

A row 1150 denotes data being output from the L1 I/O circuits of the primary divisions to the controller, a row 1151 denotes data being transferred to the L1 I/O circuits from the latches of the primary divisions via first associated L2 I/O circuits, a row 1152 denotes data being transferred to the L1 I/O circuits from the latches of the primary divisions via second associated L2 I/O circuits, a row 1153 denotes data being transferred from latches to the FIFO buffer 150 of the redundant division Div0R, a row 1154 denotes data being transferred from latches to the FIFO buffer 160 of the redundant division Div1R, and a row 1155 denotes data being transferred from the FIFO buffer 150 to the controller.

W0-W11 are successive words of read data which are transferred to the controller from the latches. Also in this example, the table 147 of in FIG. 11B indicates that the column 660 of Div3P is defective and that the corresponding word W6 should be written to C0 instead.

Referring to the row 1150, the L1 I/O circuit 516 transmits W0 (block 1100) and W1 (block 1101) at t0-t1 and t1-t2, respectively. The L1 I/O circuit 526 transmits W2 (block 1102) and W3 (block 1103) at t2-t3 and t3-t4, respectively. The L1 I/O circuit 536 transmits W4 (block 1104) and W5 (block 1105) at t4-t5 and t5-t6, respectively. Next, instead of being transmitted by the L1 I/O circuit 546 of Div3P, W6 (block 1106) is transmitted from the FIFO buffer 150 to the controller at t6-t7 (row 1155). Further, in response to W6 being transferred out of the FIFO buffer 150, row 1153 shows that null read data from C4 (block 1128) is transferred into the FIFO buffer 150 from the associated latches, from t7-t9.

Next, the L1 I/O circuit 546 transmits W7 (block 1107) to the controller. The L1 I/O circuit 516 transmits W8 (block 1108) and W9 (block 1109) at t8-t9 and t9-t10, respectively. The L1 I/O circuit 526 transmits W10 (block 1110) and W11 (block 1111) at t10-t11 and t11-t12, respectively. The process can continue for additional words.

For the primary divisions, the data transmitted to the controller from the L1 I/O circuits at a data rate R1 is transferred to the L1 I/O circuits from the latches at the lower data rate R2. For example, row 1151 shows that W0 (block 1100a), W2 (block 1102a), W4 (block 1104a), W8 (block 1108a) and W10 (1110a) can transferred from the latches to the L1 I/O circuits at t-2 to t0, t042, t2-t4, t4-t6, t6-t8 and t8-t10, respectively. Similarly, row 1152 shows that W1 (block 1101a), W3 (block 1103a), W5 (block 1105a), W7 (block 1107a), W9 (block 1109a) and W11 (block 1111a) are transferred from the latches to the L1 I/O circuits at t-2 to t0, t042, t2-t4, t4-t6, t6-t8 and t8-t10, respectively.

The data is transferred from the latches for the primary and redundant columns at the lower rate R2. Alternatively, as mentioned, the transfer rate for the redundant columns can differ from the transfer rate of the primary columns.

FIG. 11B depicts an example of the column replacement table 147 of FIG. 1, consistent with FIG. 11A. The table indicates that the primary column 660 which is normally expected to store W6 in the absence of a defect, is replaced by C0.

FIG. 11C depicts an example configuration of the FIFO buffer 150, consistent with the timeline of FIG. 11A, showing read data from columns C0-C3 being stored in the entries 151-154, respectively, where the entry 151 is selected by the pointer. In this example, the entry 151 contains usable data (W6), while the entries 152-154 comprise null data.

FIG. 11D depicts an example configuration of the FIFO buffer 150 of FIG. 11C, showing null read data from a column C4 being stored in the entry 151 after the read data W6 is output to the controller from entry 151, where the pointer is moved to select the entry 152. At this time, there is no further usable data to be output from the redundant columns.

FIG. 11E depicts an example configuration of the FIFO buffer 160, consistent with the timeline of FIG. 11A, showing null read data from columns C8-C11 being stored in the entries 161-164, respectively, where the pointer selects the entry 161. In this example, the entries 161-164 all comprise null data.

Figures 12C, 12D, 12E, 12F, 12G, 12H, 12I, 12J, 12K, 12L, 12M, 12N:
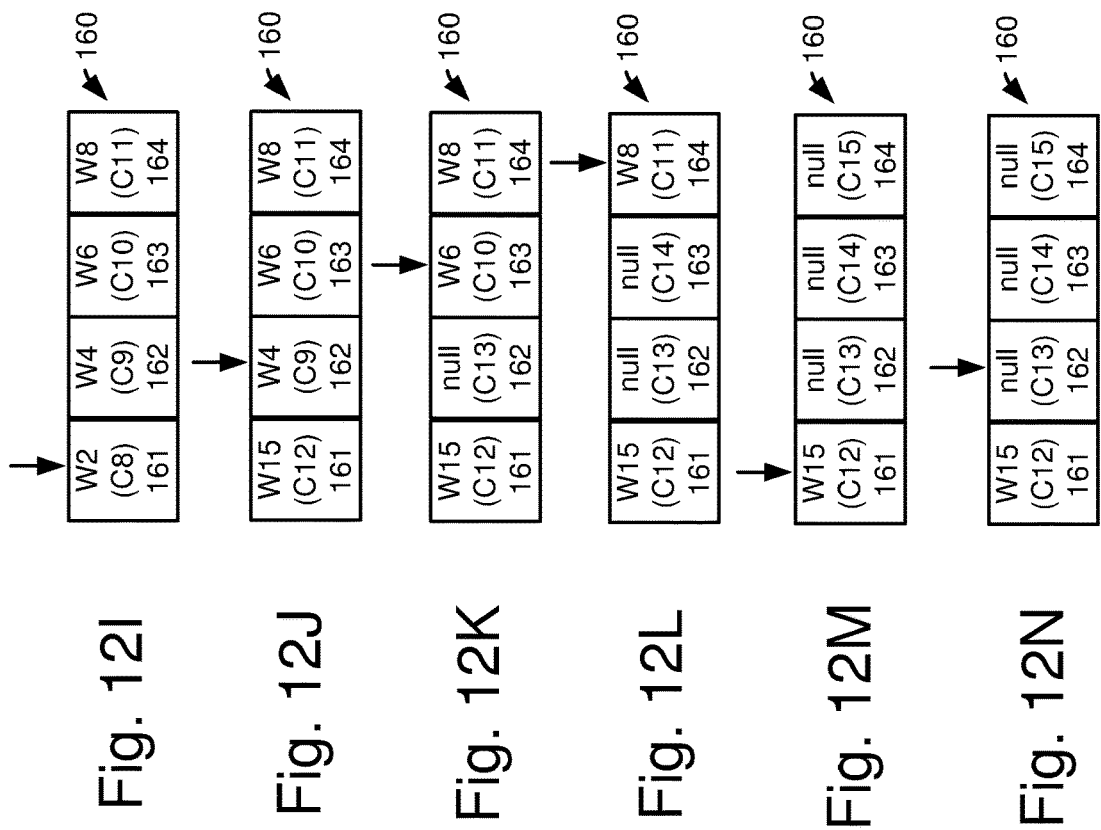
FIG. 12C depicts an example configuration of the FIFO buffer 150, consistent with the timeline of FIG. 12A, showing read data W1, W3, W5 and W7 from columns C0-C3, respectively, being stored in the entries 151-154, respectively, where the entry 151 is selected by the pointer.
FIG. 12D depicts an example configuration of the FIFO buffer 150 of FIG. 12C, showing read data W9 from a column C4 being stored in the entry 151 after the read data W1 is output to the controller from the entry 151, where the pointer is moved to select the entry 152.
FIG. 12E depicts an example configuration of the FIFO buffer 150 of FIG. 12D, showing null read data from a column C5 being stored in the entry 152 after the read data W3 is output to the controller from the entry 152, where the pointer is moved to select the entry 153.
FIG. 12F depicts an example configuration of the FIFO buffer 150 of FIG. 12E, showing null read data from a column C6 being stored in the entry 153 after the read data W5 is output to the controller from the entry 153, where the pointer is moved to select the entry 154.
FIG. 12G depicts an example configuration of the FIFO buffer 150 of FIG. 12F, showing null read data from a column C7 being stored in the entry 154 after the read data W7 is output to the controller from the entry 154, where the pointer is moved to select the entry 151.
FIG. 12H depicts an example configuration of the FIFO buffer 150 of FIG. 12G, after the read data W9 is output to the controller from the entry 151, where the pointer is moved to select the entry 152, and there is no further read data to store in the FIFO buffer.
FIG. 12I depicts an example configuration of the FIFO buffer 160, consistent with the timeline of FIG. 12A, showing read data W2, W4, W6 and W8 from columns C8-C11, respectively, being stored in the entries 161-164, respectively, where the entry 161 is selected by the pointer.
FIG. 12J depicts an example configuration of the FIFO buffer 160 of FIG. 12I, showing read data W15 from a column C12 being stored in the entry 161 after the read data W2 is output to the controller from the entry 161, where the pointer is moved to select the entry 162.
FIG. 12K depicts an example configuration of the FIFO buffer 160 of FIG. 12J, showing null read data from a column C13 being stored in the entry 162 after the read data W4 is output to the controller from the entry 162, where the pointer is moved to select the entry 163.
FIG. 12L depicts an example configuration of the FIFO buffer 160 of FIG. 12K, showing null read data from a column C14 being stored in the entry 163 after the read data W6 is output to the controller from the entry 163, where the pointer is moved to select the entry 164.
FIG. 12M depicts an example configuration of the FIFO buffer 160 of FIG. 12L, showing null read data from a column C15 being stored in the entry 164 after the read data W8 is output to the controller from the entry 164, where the pointer is moved to select the entry 161.
FIG. 12N depicts an example configuration of the FIFO buffer 160 of FIG. 12M, after the read data W15 is output to the controller from the entry 161, where the pointer is moved to select the entry 162, and there is no further read data to store in the FIFO buffer.

FIG. 12A depicts an example timeline in a read operation using the access circuitry of FIG. 6A, and consistent with the process of FIG. 8C, where there are ten bad columns. This example includes a relatively large number of bad columns, to show how the pointer in the FIFO buffer is cycled through the entries (FIG. 12C-12N). The data rate is R1 for rows 1250, 1255 and 1256 and R2<R1 for rows 1251-1254. In the prefetch period, row 1253 denotes W1, W3, W5 and W7 being transferred from latches of C0 (block 1120), C1 (block 1121), C2 (block 1122) and C3 (block 1123) to the FIFO buffer 150 of the redundant division Div0R, from t-8 to t-6, t-6 to t-4, t-4 to t-2 and t-2 to t0, respectively. Similarly, row 1254 denotes W2, W4, W6 and W8 being transferred from latches of C8 (block 1124), C9 (block 1125), C10 (block 1126) and C11 (block 1127) to the FIFO buffer 160 of the redundant division Div0R, from t-8 to t-6, t-6 to t-4, t-4 to t-2 and t-2 to t0, respectively. In this example, the data of the ten bad columns is stored in C0-C4 and C8-C12. At the end of the prefetch process, the data of eight of the columns is stored in the FIFO buffers, while additional data remains in the latches of C4 (W9) and C12 (W15).

After the prefetch process, row 1253 denotes data being transferred from latches of C4 (block 1130), C1 (block 1121), C2 (block 1122) and C3 (block 1123) to the FIFO 150 of the redundant division Div0R, from t-8 to t-6, t-6 to t-4, t-4 to t-2 and t-2 to t0, respectively. Similarly, row 1254 denotes data being transferred from latches of C8 (block 1124), C9 (block 1125), C10 (block 1126) and C11 (block 1127) to the FIFO buffer 160 of the redundant division Div0R, from t-8 to t-6, t-6 to t-4, t-4 to t-2 and t-2 to t0, respectively.

A row 1250 denotes data being output from the L1 I/O circuits of the primary divisions to the controller, a row 1251 denotes data being transferred to the L1 I/O circuits from the latches of the primary divisions via first associated L2 I/O circuits, a row 1252 denotes data being transferred to the L1 I/O circuits from the latches of the primary divisions via second associated L2 I/O circuits, the row 1253 denotes data being transferred from latches to the FIFO buffer 150 of the redundant division Div0R, the row 1254 denotes data being transferred from latches to the FIFO buffer 160 of the redundant division Div1R, a row 1255 denotes data being transferred from the FIFO buffer 150 to the controller, and a row 1256 denotes data being transferred from the FIFO buffer 160 to the controller.

W0-W11 are successive words of read data which are transferred to the controller from the latches.

Row 1251 shows that W0 (block 1100a) and W10 (1110a) are transferred from the latches of the primary columns to the L1 I/O circuits 516 and 526 at t-2 to t0 and t8-t10, respectively. Similarly, row 1252 shows that W11 (block 1111a) is transferred from the latches of the primary columns to the L1 I/O circuit 526 at t8-t10.

Referring to the row 1250, the L1 I/O circuit 516 transmits W0 (block 1100) at t0-t1 to the controller. Next, instead of being transmitted by the L1 I/O circuit 516, W1 (block 1101b) is transmitted from the FIFO buffer 150 to the controller at t1-t2 (row 1255). Next, instead of being transmitted by the L1 I/O circuit 526, W2 (block 1102b) is transmitted from the FIFO buffer 160 to the controller at t2-t3 (row 1256). Next, instead of being transmitted by the L1 I/O circuit 526, W3 (block 1103b) is transmitted from the FIFO buffer 150 to the controller at t3-t4 (row 1255).

Next, instead of being transmitted by the L1 I/O circuit 536, W4 (block 1104b) is transmitted from the FIFO buffer 160 to the controller at t4-t5 (row 1256). Next, instead of being transmitted by the L1 I/O circuit 536, W5 (block 1105b) is transmitted from the FIFO buffer 150 to the controller at t5-t6 (row 1255).

Next, instead of being transmitted by the L1 I/O circuit 546, W6 (block 1106a) is transmitted from the FIFO buffer 160 to the controller at t6-t7 (row 1256). Next, instead of being transmitted by the L1 I/O circuit 546, W7 (block 1107b) is transmitted from the FIFO buffer 150 to the controller at t7-t8 (row 1255).

Next, instead of being transmitted by the L1 I/O circuit 516, W8 (block 1108b) is transmitted from the FIFO buffer 160 to the controller at t8-t9 (row 1256). Next, instead of being transmitted by the L1 I/O circuit 516, W9 (block 1109b) is transmitted from the FIFO buffer 150 to the controller at t9-t10 (row 1255). Finally, instead of being transmitted by the L1 I/O circuit 526, W15 (block 1127a) is transmitted from the FIFO buffer 160 to the controller at t10411 (row 1256).

In response to W1 being transferred out of the FIFO buffer 150, W9 (block 1130) is transferred from the latches of C4 to the entry of the FIFO buffer which had stored W1, at t2-t4. See FIG. 12D. Similarly, in response to W3 being transferred out of the FIFO buffer 150, null data (block 1132) is transferred from the latches of C5 to the entry of the FIFO buffer which had stored W3. See FIG. 12E. In response to W5 being transferred out of the FIFO buffer 150, null data (block 1134) is transferred from the latches of C6 to the entry of the FIFO buffer which had stored W5. See FIG. 12F. In response to W7 being transferred out of the FIFO buffer 150, null data (block 1136) is transferred from the latches of C7 to the entry of the FIFO buffer which had stored W7. See FIG. 12G. In response to W9 being transferred out of the FIFO buffer 150, there is no further data from Div0R to transfer to the entry of the FIFO buffer which had stored W9. See FIG. 12H.

In response to W2 being transferred out of the FIFO buffer 160, W15 (block 1131) is transferred from the latches of C12 to the entry of the FIFO buffer which had stored W2, at t3-t5. See FIG. 12J. Similarly, in response to W4 being transferred out of the FIFO buffer 160, null data (block 1133) is transferred from the latches of C13 to the entry of the FIFO buffer which had stored W4. See FIG. 12K. In response to W6 being transferred out of the FIFO buffer 160, null data (block 1135) is transferred from the latches of C14 to the entry of the FIFO buffer which had stored W6. See FIG. 12L. In response to W8 being transferred out of the FIFO buffer 160, null data (block 1137) is transferred from the latches of C15 to the entry of the FIFO buffer which had stored W8. See FIG. 12M. In response to W15 being transferred out of the FIFO buffer 160, there is no further data from Div0R to transfer to the entry of the FIFO buffer which had stored W15. See FIG. 12N.

FIG. 12B depicts an example of the column replacement table 147 of FIG. 1, consistent with FIG. 12A. The table indicates that the columns 631, 640, 641, 650, 651, 660, 661, 632, 633 and 663 are defective and that the corresponding words W1, W2, W3, W4, W5, W6, W7, W8, W9 and W15, respectively, should be written to C0, C8, C1, C9, C2, C10, C3, C11, C4 and C12, respectively, instead. The remaining redundant columns, e.g., C5-C7 and C13-C15, store null data.

FIG. 12C-12H depict different data stored in the FIFO buffer 150, consistent with FIGS. 12A and 12B. FIG. 12I-

12N depict different data stored in the FIFO buffer 160, consistent with FIGS. 12A and 12B.

FIG. 12C depicts an example configuration of the FIFO buffer 150, consistent with the timeline of FIG. 12A, showing read data W1, W3, W5 and W7 from columns C0-C3, respectively, being stored in the entries 151-154, respectively, where the first entry 151 is selected by the pointer. This configuration is obtained at t0 in FIG. 12A, at the end of the prefetch process.

FIG. 12D depicts an example configuration of the FIFO buffer 150 of FIG. 12C, showing read data W9 from a column C4 being stored in the entry 151 after the read data W1 is output to the controller from the entry 151, where the pointer is moved to select the second entry 152. This configuration is obtained at t4 in FIG. 12A. Since the pointer is moved to entry 152, entry 151 can be overwritten.

FIG. 12E depicts an example configuration of the FIFO buffer 150 of FIG. 12D, showing null read data from a column C5 being stored in the entry 152 after the read data W3 is output to the controller from the entry 152, where the pointer is moved to select the third entry 153. This configuration is obtained at t6 in FIG. 12A.

FIG. 12F depicts an example configuration of the FIFO buffer 150 of FIG. 12E, showing null read data from a column C6 being stored in the entry 153 after the read data W5 is output to the controller from the entry 153, where the pointer is moved to select the fourth entry 154. This configuration is obtained at t8 in FIG. 12A.

FIG. 12G depicts an example configuration of the FIFO buffer 150 of FIG. 12F, showing null read data from a column C7 being stored in the entry 154 after the read data W7 is output to the controller from the entry 154, where the pointer is moved to again select the first entry 151. This configuration is obtained at t10 in FIG. 12A.

FIG. 12H depicts an example configuration of the FIFO buffer 150 of FIG. 12G, after the read data W9 is output to the controller from the entry 151, where the pointer is moved to select the entry 152, and there is no further read data to store in the FIFO buffer from Div0R.

FIG. 12I depicts an example configuration of the FIFO buffer 160, consistent with the timeline of FIG. 12A, showing read data W2, W4, W6 and W8 from columns C8-C11, respectively, being stored in the entries 161-164, respectively, where the first entry 161 is selected by the pointer. This configuration is obtained at t0 in FIG. 12A.

FIG. 12J depicts an example configuration of the FIFO buffer 160 of FIG. 12I, showing read data W15 from a column C12 being stored in the entry 161 after the read data W2 is output to the controller from the entry 161, where the pointer is moved to select the second entry 162. This configuration is obtained at t5 in FIG. 12A.

FIG. 12K depicts an example configuration of the FIFO buffer 160 of FIG. 12J, showing null read data from a column C13 being stored in the entry 162 after the read data W4 is output to the controller from the entry 162, where the pointer is moved to select the entry third 163. This configuration is obtained at t7 in FIG. 12A.

FIG. 12L depicts an example configuration of the FIFO buffer 160 of FIG. 12K, showing null read data from a column C14 being stored in the entry 163 after the read data W6 is output to the controller from the entry 163, where the pointer is moved to select the fourth entry 164. This configuration is obtained at t9 in FIG. 12A.

FIG. 12M depicts an example configuration of the FIFO buffer 160 of FIG. 12L, showing null read data from a column C15 being stored in the entry 164 after the read data W8 is output to the controller from the entry 164, where the pointer is moved to again select the first entry 161. This configuration is obtained at t10 in FIG. 12A.

FIG. 12N depicts an example configuration of the FIFO buffer 160 of FIG. 12M, after the read data W15 is output to the controller from the entry 161, where the pointer is moved to select the entry 162, and there is no further read data to store in the FIFO buffer. This configuration is obtained at t11 in FIG. 12A.

Accordingly, it can be see that in one implementation, an apparatus comprises: block of memory cells arranged in columns, the columns comprising primary columns and redundant columns; latches for the primary columns; latches for the redundant columns; input/output circuits for the primary columns; input/output circuits for the redundant columns; and a first-in, first-out buffer associated with the input/output circuits for the redundant columns, wherein the first-in, first-out buffer is configured to transfer data to and from the latches for the redundant columns via the input/output circuits for the redundant columns, and to transfer data to and from a controller via a bus.

In another implementation, a method comprises: at input/output circuits for primary columns of a block of memory cells, exchanging data with latches for the primary columns; and at a first-in, first out buffer which operates asynchronously relative to the input/output circuits for the primary columns: (a) in a program operation, receiving write data from a controller, buffering the write data, and subsequently transferring the write data to latches for redundant columns of the block; and (b) in a read operation, receiving read data from the latches for the redundant columns, buffering the read data, and subsequently transferring the read data to the controller.

In another implementation, an apparatus comprises: a block of memory cells arranged in columns, the columns comprising primary columns and redundant columns; latches for the primary columns; latches for the redundant columns; a first set of input/output circuits for the primary columns; a second set of input/output circuits for the primary columns; each input/output circuit of the first set of input/output circuits is configured to receive multiple words of data in a program operation and to transfer the multiple words of data to the second set of input/output circuits, one word of data per input/output circuit of the second set of input/output circuits; input/output circuits for the redundant columns; and a first-in, first-out buffer associated with the input/output circuits for the redundant columns, the first-in, first-out buffer configured to receive one word of data in the program operation and to transfer the one word of data to one input/output circuit of the input/output circuits for the redundant columns.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a plurality of memory cells arranged in columns, the columns comprising primary columns and redundant columns;

latches for the primary columns;
latches for the redundant columns;
input/output circuits for the primary columns;
input/output circuits for the redundant columns; and
a first-in, first-out buffer associated with the input/output circuits for the redundant columns, the first-in, first-out buffer is configured to transfer data to and from the latches for the redundant columns via the input/output circuits for the redundant columns, and to transfer data to and from a controller via a bus, wherein the first-in, first-out buffer, in a read operation involving the plurality of memory cells, is configured to prefetch data from multiple columns of the redundant columns from the input/output circuits for the redundant columns, prior to data of the primary columns being output to the controller via the input/output circuits for the primary columns.

2. The apparatus of claim 1, wherein:
the first-in, first-out buffer is configured to store a number M entries, each entry storing a column of data of the redundant columns and, in a read operation involving the plurality of memory cells, transfer out one entry of the M entries to a controller via the bus to replace one bad column among the primary columns.

3. The apparatus of claim 2, wherein:
in response to the one entry being transferred out of the first-in, first-out buffer, the first-in, first-out buffer is configured to replace the entry with another column of data of the redundant columns move a pointer of the first-in, first-out buffer to a next entry of the first-in, first-out buffer.

4. A method, comprising:
at input/output circuits for primary columns of a block of memory cells, exchanging data with latches for the primary columns; and
at a first-in, first out buffer which operates asynchronously relative to the input/output circuits for the primary columns:
   in a program operation, receiving write data from a controller, buffering the write data, and subsequently transferring the write data to latches for redundant columns of the block; and
   in a read operation, receiving read data from the latches for the redundant columns, buffering the read data, and subsequently transferring the read data to the controller, wherein the first-in, first-out buffer receives the read data from the latches for the redundant columns at a selected data rate among a plurality of available data rates.

5. The method of claim 4, wherein:
a clock signal provided to the first-in, first-out buffer sets the selected data rate.

6. The method of claim 4, wherein:
the first-in, first-out buffer transfers the write data to the latches for the redundant columns at one data rate and receives the read data from the latches for the redundant columns at another data rate.

7. The method of claim 4, wherein:
the first-in, first-out buffer concurrently buffers read data from multiple columns of the redundant columns.

8. The method of claim 4, wherein:
in the program operation, the receiving of the write data is at a first data rate, and the subsequent transferring of the write data to the latches for the redundant columns is at a second data rate which is less than the first data rate.

9. The method of claim 4, wherein:
in the read operation, the transferring of the read data to the controller is at a first data rate, and the receiving of the read data from the latches for the redundant columns is at a second data rate which is less than the first data rate.

10. An apparatus, comprising:
a block of memory cells arranged in columns, the columns comprising primary columns and redundant columns;
latches for the primary columns;
latches for the redundant columns;
a first set of input/output circuits for the primary columns;
a second set of input/output circuits for the primary columns;
each input/output circuit of the first set of input/output circuits is configured to receive multiple words of data in a program operation and to transfer the multiple words of data to the second set of input/output circuits, one word of data per input/output circuit of the second set of input/output circuits;
input/output circuits for the redundant columns; and
a first-in, first-out buffer associated with the input/output circuits for the redundant columns, the first-in, first-out buffer is configured to receive one word of data in the program operation and to transfer the one word of data to one input/output circuit of the input/output circuits for the redundant columns, wherein:
   the first-in, first-out buffer is configured to receive the one word of data at a first data rate; and
   each input/output circuit of the first set of input/output circuits is configured to receive the multiple words of data at the first data rate.

11. The apparatus of claim 10, wherein:
the first-in, first-out buffer is configured to perform the transfer of the one word of data at a second data rate which is lower than the first data rate.

12. The apparatus of claim 10, wherein:
each input/output circuit of the first set of input/output circuits is configured to perform the transfer of the multiple words of data at a second data rate which is lower than the first data rate.

13. An apparatus, comprising:
a plurality of memory cells arranged in columns, the columns comprising primary columns and redundant columns;
latches for the primary columns;
latches for the redundant columns;
input/output circuits for the primary columns;
input/output circuits for the redundant columns; and
a first-in, first-out buffer associated with the input/output circuits for the redundant columns, the first-in, first-out buffer is configured to transfer data to and from the latches for the redundant columns via the input/output circuits for the redundant columns, and to transfer data to and from a controller via a bus, wherein:
   the redundant columns are arranged in a plurality of divisions; and
   a respective first-in, first-out buffer is associated with the input/output circuits for the redundant columns, for each respective division of the plurality of divisions.

14. The apparatus of claim 13, wherein:
each respective first-in, first-out buffer has a capacity which is less than a capacity of a row of memory cells in the respective division.

15. An apparatus, comprising:
a plurality of memory cells arranged in columns, the columns comprising primary columns and redundant columns;
latches for the primary columns;
latches for the redundant columns;
input/output circuits for the primary columns;
input/output circuits for the redundant columns; and
a first-in, first-out buffer associated with the input/output circuits for the redundant columns, the first-in, first-out buffer is configured to transfer data to and from the latches for the redundant columns via the input/output circuits for the redundant columns, and to transfer data to and from a controller via a bus, wherein:
the input/output circuits for the primary columns comprise a first set of input/output circuits and a second set of input/output circuits;
the first set of input/output circuits is configured to transfer data between the bus and the second set of input/output circuits at a first data rate;
the second set of input/output circuits is configured to transfer data between the latches for the primary columns and the first set of input/output circuits at a second data rate which is less than the first data rate; and
the first-in, first-out buffer is configured to exchange data with the latches for the redundant columns at a data rate which is lower than the first data rate.

16. The apparatus of claim 15, wherein:
the data rate which is lower than the first data rate is the second data rate.

17. The apparatus of claim 15, wherein:
the exchanging of data comprises transferring data to the latches for the redundant columns at the data rate which is lower than the first data rate in a program operation involving the plurality of memory cells, in which a bad column among the primary columns is replaced by a column among the redundant columns.

18. The apparatus of claim 15, wherein:
the exchanging of data comprises receiving data from the latches for the redundant columns at the data rate which is lower than the first data rate in a read operation involving the plurality of memory cells, in which a bad column among the primary columns is replaced by a column among the redundant columns.

\* \* \* \* \*